(12) United States Patent
Yamashita et al.

(10) Patent No.: US 10,429,480 B2
(45) Date of Patent: Oct. 1, 2019

(54) COMBINING MULTIPLE MRI DATA ACQUISITIONS HAVING DIFFERENT B1 INHOMOGENEITIES

(75) Inventors: Yuichi Yamashita, Nasusiobara (JP); Masao Yui, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1494 days.

(21) Appl. No.: 13/438,141

(22) Filed: Apr. 3, 2012

(65) Prior Publication Data
US 2012/0187948 A1   Jul. 26, 2012

Related U.S. Application Data
(63) Continuation of application No. PCT/JP2011/062282, filed on May 27, 2011.

(30) Foreign Application Priority Data

May 27, 2010 (JP) .................... 2010-121641

(51) Int. Cl.
G01R 33/565 (2006.01)
G01R 33/48 (2006.01)
G01R 33/561 (2006.01)

(52) U.S. Cl.
CPC ...... *G01R 33/5659* (2013.01); *G01R 33/4818* (2013.01); *G01R 33/5619* (2013.01)

(58) Field of Classification Search
USPC ................ 324/300–322; 600/407–435; 382/128–131
See application file for complete search history.

(56) References Cited

U.S. PATENT DOCUMENTS 5,109,854 A  *  5/1992  Provost .................. G01R 33/56
                                                      324/309
5,544,653 A  *  8/1996  Takahashi .......... G01R 33/4835
                                                      324/309

(Continued)

FOREIGN PATENT DOCUMENTS

CN       1616985 A       5/2005
JP       62-073148       4/1987

(Continued)

OTHER PUBLICATIONS

Office Action dated Sep. 11, 2014 in JP Patent Application No. 2011-119608 with English translation.

(Continued)

*Primary Examiner* — Melissa J Koval
*Assistant Examiner* — Tiffany A Fetzner
(74) *Attorney, Agent, or Firm* — Nixon & Vanderhye P.C.

(57) ABSTRACT

A magnetic resonance imaging apparatus according to an embodiment includes a first acquiring unit, a second acquiring unit, and a combining unit. The first acquiring unit is configured to acquire data by executing a pulse sequence based on a first radio-frequency pulse transmission condition. The second acquiring unit is configured to acquire data by executing a pulse sequence based on a second radio-frequency pulse transmission condition that is different from the first radio-frequency pulse transmission condition. The combining unit is configured to perform a combining process either on the data acquired by the first acquiring unit and the data acquired by the second acquiring unit or on data obtained by reconstructing the data acquired by the first acquiring unit and data obtained by reconstructing the data acquired by the second acquiring unit.

9 Claims, 16 Drawing Sheets

(56) References Cited

U.S. PATENT DOCUMENTS

| | | | | |
|---|---|---|---|---|
| 6,150,815 | A * | 11/2000 | Janzen | B82Y 25/00 324/307 |
| 6,265,873 | B1 * | 7/2001 | Le Roux | G01R 33/5615 324/307 |
| 6,900,636 | B2 | 5/2005 | Leussler | 324/318 |
| 6,989,673 | B2 * | 1/2006 | Zhu | G01R 33/3415 324/318 |
| 7,038,453 | B2 * | 5/2006 | Feiweier | G01R 33/583 324/309 |
| 7,053,618 | B2 * | 5/2006 | Zhu | G01R 33/288 324/309 |
| 7,064,546 | B2 * | 6/2006 | Feiweier | G01R 33/583 324/307 |
| 7,075,301 | B2 * | 7/2006 | Zhu | G01R 33/3415 324/309 |
| 7,183,770 | B2 * | 2/2007 | Gra.beta.lin | G01R 33/3415 324/318 |
| 7,307,419 | B2 * | 12/2007 | Zhu | G01R 33/3415 324/307 |
| 7,319,324 | B2 | 1/2008 | Kannengießer et al. | 324/309 |
| 7,385,396 | B2 * | 6/2008 | Zhu | G01R 33/288 324/307 |
| 7,423,430 | B1 * | 9/2008 | Sharif | G01R 33/56325 324/309 |
| 7,511,489 | B2 * | 3/2009 | Fautz | G01R 33/5611 324/307 |
| 7,765,425 | B1 | 7/2010 | Harvey et al. | 713/503 |
| 7,808,240 | B2 * | 10/2010 | Zhu | G01R 33/288 324/309 |
| 7,915,892 | B2 | 3/2011 | Okamoto | 324/318 |
| 7,928,729 | B2 * | 4/2011 | Hargreaves | G01R 33/4833 324/307 |
| 8,169,219 | B2 * | 5/2012 | Morrell | G01R 33/5612 324/309 |
| 8,299,791 | B2 * | 10/2012 | Morrell | G01R 33/4833 324/309 |
| 8,831,318 | B2 * | 9/2014 | Sharif | G01R 33/5611 382/131 |
| 2003/0076099 | A1 * | 4/2003 | Hajnal | G01R 33/5611 324/309 |
| 2004/0164737 | A1 * | 8/2004 | Feiweier | G01R 33/583 324/309 |
| 2005/0073304 | A1 * | 4/2005 | Feiweier | G01R 33/583 324/307 |
| 2005/0110487 | A1 * | 5/2005 | Zhu | G01R 33/3415 324/309 |
| 2005/0110488 | A1 * | 5/2005 | Zhu | G01R 33/288 324/309 |
| 2005/0134267 | A1 * | 6/2005 | Zhu | G01R 33/3415 324/309 |
| 2005/0134268 | A1 * | 6/2005 | Zhu | G01R 33/288 324/309 |
| 2006/0261810 | A1 * | 11/2006 | Fautz | G01R 33/5611 324/309 |
| 2007/0247155 | A1 * | 10/2007 | Zhu | G01R 33/288 324/318 |
| 2009/0273346 | A1 * | 11/2009 | Zhu | G01R 33/288 324/314 |
| 2010/0013477 | A1 * | 1/2010 | Morrell | G01R 33/4833 324/309 |
| 2011/0286648 | A1 * | 11/2011 | Sharif | G01R 33/5611 382/131 |
| 2012/0187947 | A1 * | 7/2012 | Morrell | G01R 33/4833 324/309 |
| 2012/0187948 | A1 * | 7/2012 | Yamashita | G01R 33/5659 324/318 |
| 2013/0076356 | A1 * | 3/2013 | Jellus | G01R 33/56563 324/309 |

FOREIGN PATENT DOCUMENTS

| | | |
|---|---|---|
| JP | 1-141653 | 6/1989 |
| JP | 5-261078 | 10/1993 |
| JP | 10-137212 | 5/1998 |
| JP | 4004964 | 8/2007 |
| JP | 2008-067830 | 3/2008 |
| JP | 2008-514256 | 5/2008 |
| JP | 2008-295925 | 12/2008 |
| JP | 2008-296011 A | 12/2008 |
| WO | WO 02/095435 | 11/2002 |
| WO | WO 2006/033047 | 3/2006 |

OTHER PUBLICATIONS

Hoogeveen et al., "Fast dynamic, high resolution contrast-enhanced MR angiography with CENTRA keyhole and SENSE", *Proc. Intl. Soc. Mag. Reson. Med.*, vol. 22, 2004, p. 9.

Bernstein et al., "Handbook of MRI Pulse Sequences", *Elsevier Academic Press*, No Date, pp. 386-387.

Sodickson et al., "Simultaneous Acquisition of Spatial Harmonics (SMASH): Fast Imaging and Radiofrequency Coil Arrays", *MRM*, vol. 38, 1997, pp. 591-603.

Office Action dated Mar. 31, 2015 in JP Patent Application No. 2011-119608.

Office Action dated Jul. 16, 2013 in Chinese Application No. 201180002009.0.

\* cited by examiner

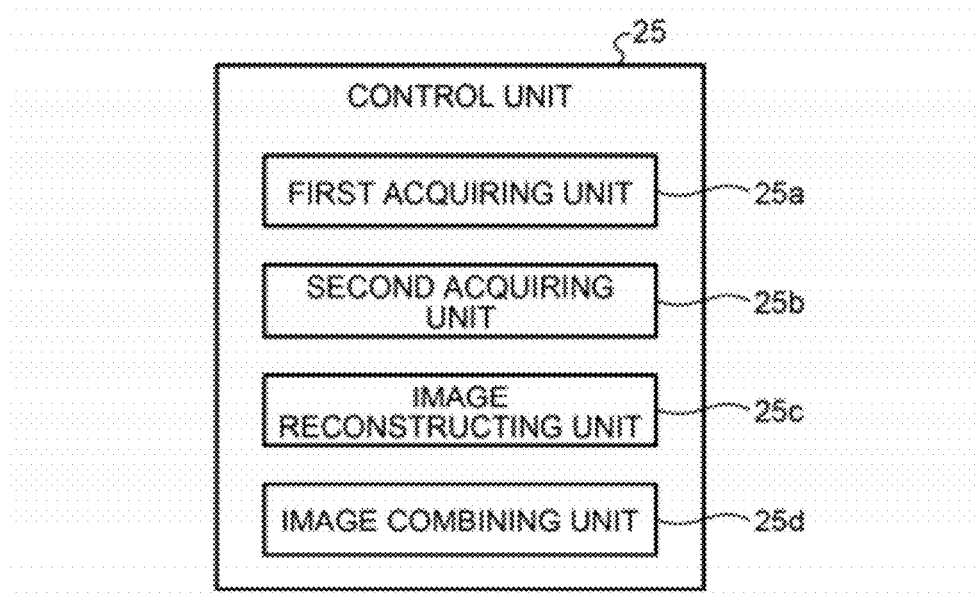

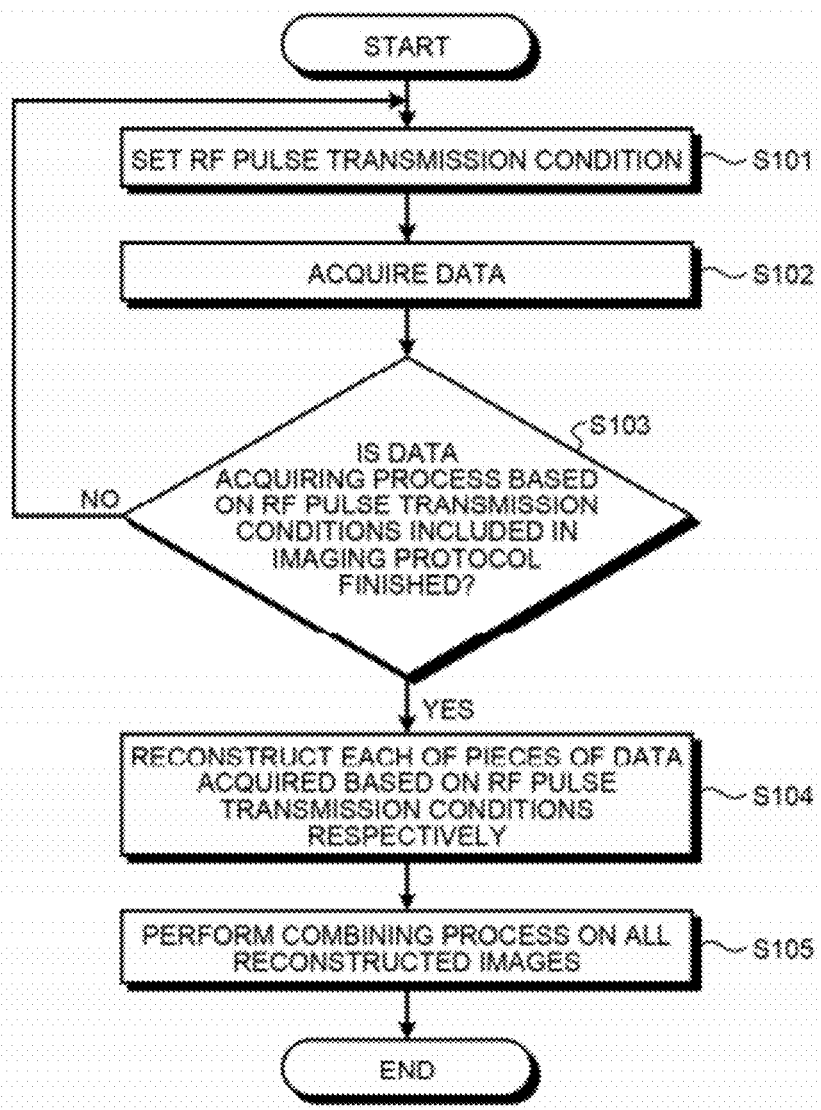

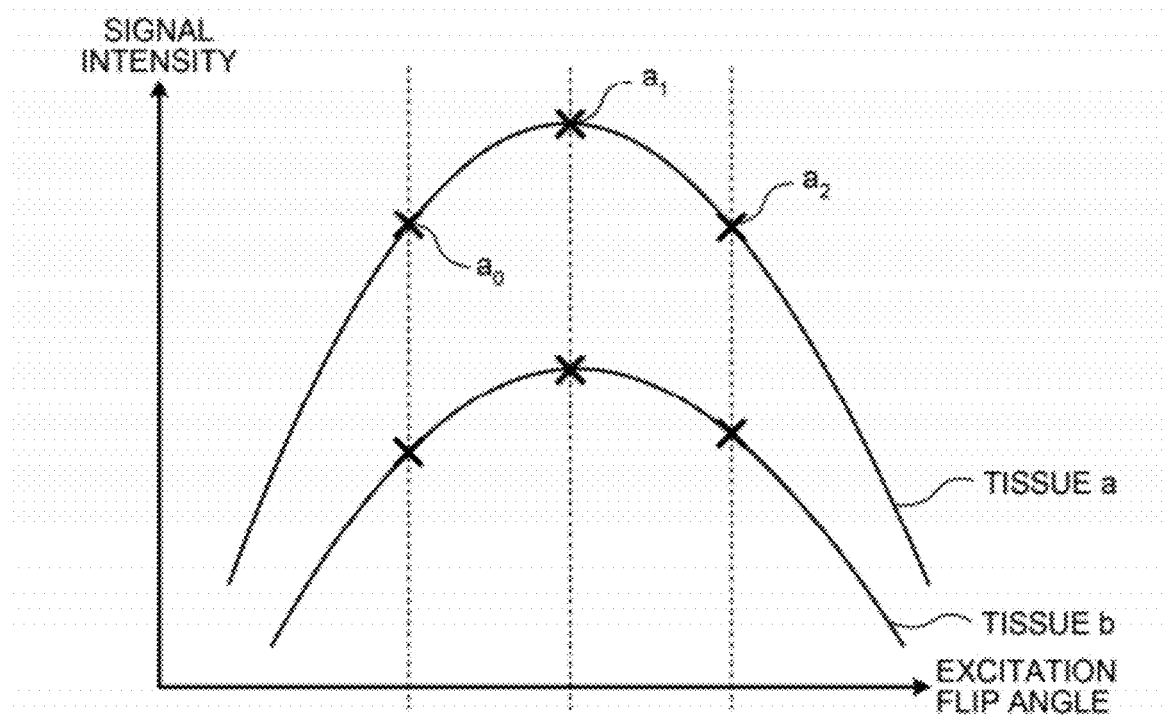

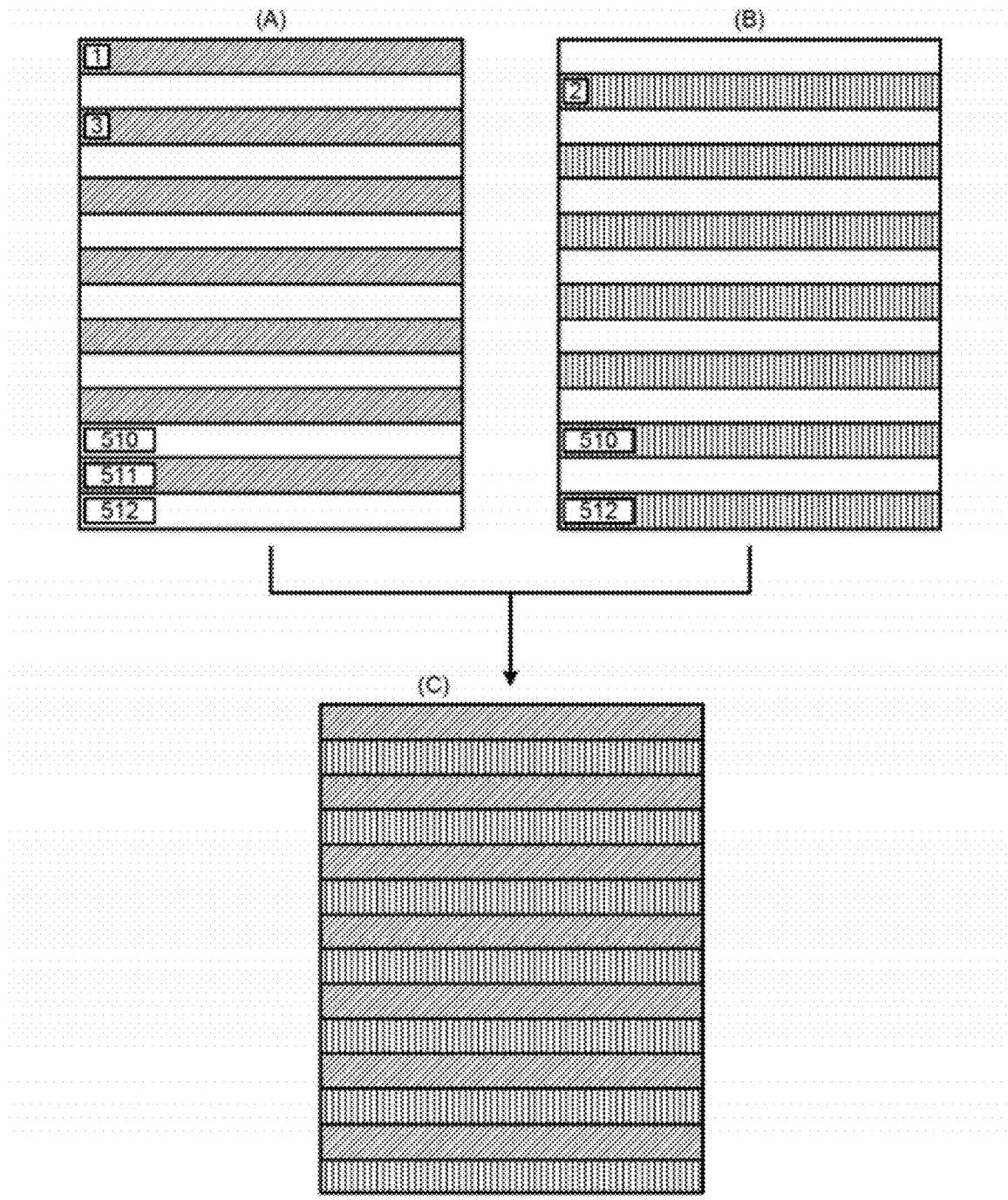

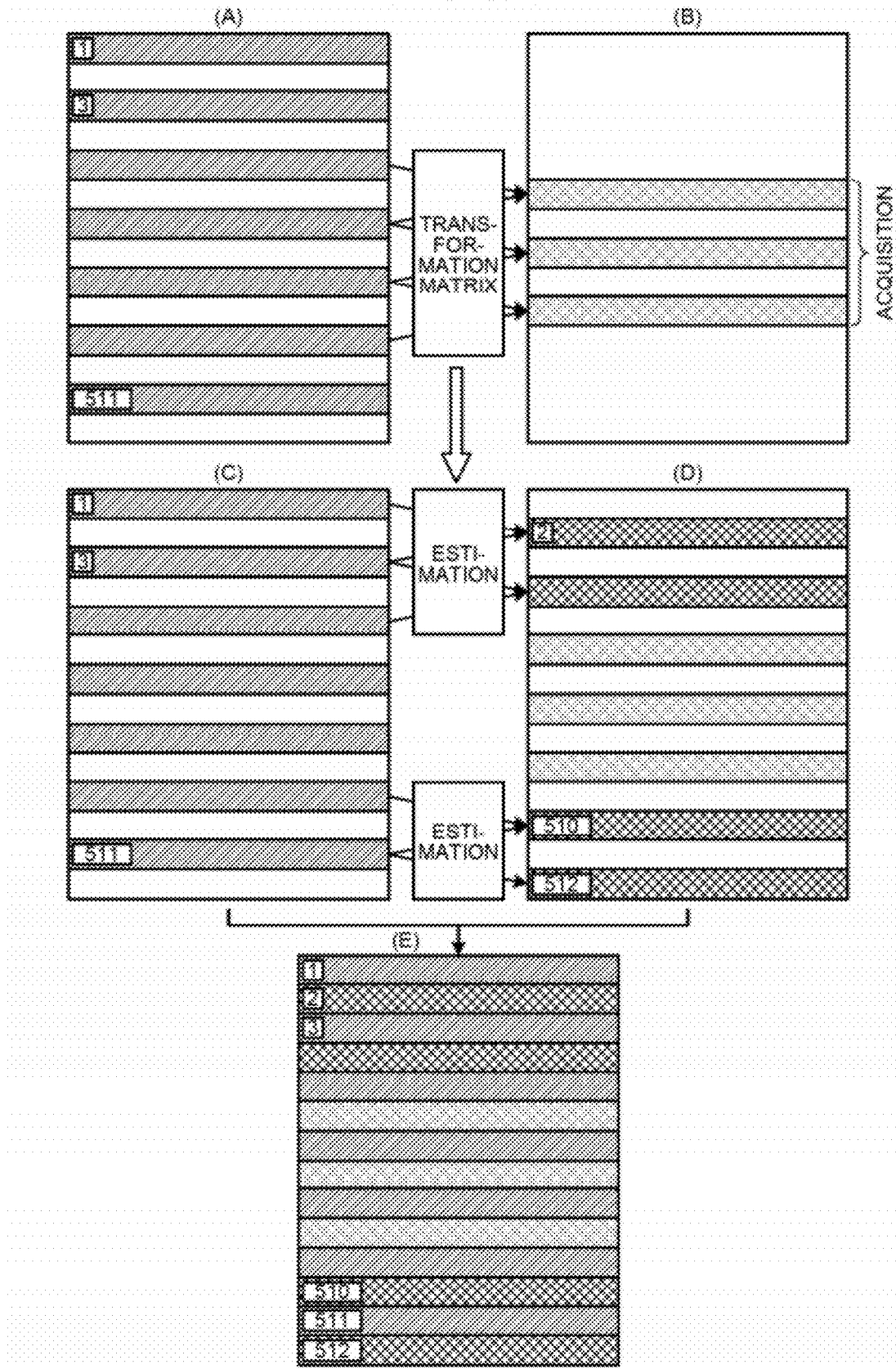

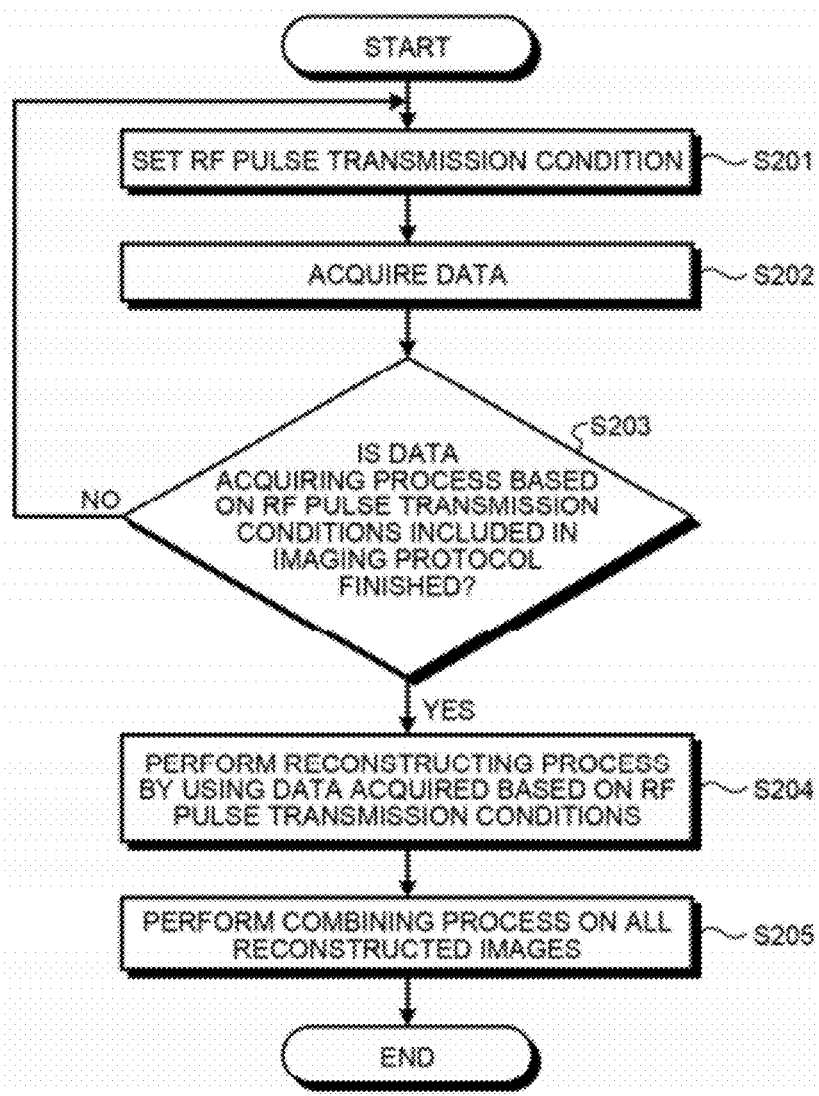

COMBINING MULTIPLE MRI DATA ACQUISITIONS HAVING DIFFERENT B1 INHOMOGENEITIES

CROSS-REFERENCE TO RELATED APPLICATIONS

This application is a continuation of PCT international application Ser. No. PCT/JP2011/062282 filed on May 27, 2011 which designates the United States, and which claims the benefit of priority from Japanese Patent Application No. 2010-121641, filed on May 27, 2010; the entire contents of which are incorporated herein by reference.

FIELD

Embodiments described herein relate generally to a magnetic resonance imaging apparatus.

BACKGROUND

Imaging processes performed by Magnetic Resonance Imaging apparatus (hereinafter, "MRI apparatus") use methods by which the inside of an examined subject is shown in an image while utilizing nuclear magnetic resonance phenomena. More specifically, to cause a nuclear magnetic resonance phenomenon, an MRI apparatus applies a radio-frequency pulse (hereinafter, an "RF pulse") corresponding to a resonance frequency to a transmission coil, so that the transmission coil generates a radio-frequency magnetic field (hereinafter, an "RF (B1) magnetic field").

In this situation, because the resonance frequency is proportional to the strength of a magnetostatic field, a relationship is observed where, when the strength of the magnetostatic field becomes higher, the resonance frequency also becomes higher; however, for example, when the magnetostatic field strength exceeds 1.5 tesla (T), the distribution of RF (B1) magnetic fields becomes inhomogeneous due to electrical losses and dielectric resonances occurring on the inside of the subject. In other words, the RF (B1) strength levels become inhomogeneous on the inside of the subject, and the homogeneity of the image also becomes lower. More specifically, partial lowering of the signals and/or lowering of the contrast are observed in the image, which result in degradations of the image. To cope with this situation, for MRI apparatuses of which the magnetostatic field strength exceeds 1.5 T, for example, methods have conventionally been proposed for making the RF (B1) strength levels homogenous.

Even with the conventional techniques, however, it is still difficult to make the RF (B1) strength levels completely homogenous, and the problem of inhomogeneity of the RF (B1) strength levels still remains. Thus, the problem of the degradations of the image caused by the inhomogeneity of the RF (B1) strength levels also still remains. To cope with this situation, there is a demand for a technique that is able to reduce degradations of the image caused by the inhomogeneity of the RF (B1) strength levels.

BRIEF DESCRIPTION OF THE DRAWINGS

FIG. 2 is a diagram of a control unit according to the first embodiment.
FIG. 3 is a flowchart of a processing procedure performed by the control unit according to the first embodiment.
FIG. 4 is a drawing for explaining a technical significance of a combining process performed by an image combining unit according to the first embodiment.
FIG. 9A is a drawing for explaining a data acquiring process according to a second embodiment.
FIG. 9B is a drawing for explaining a modification example of the data acquiring process according to the second embodiment.
FIG. 11 is a flowchart of a processing procedure performed by a control unit according to the second embodiment.

DETAILED DESCRIPTION

A magnetic resonance imaging apparatus according to an embodiment includes a first acquiring unit, a second acquiring unit, and a combining unit. The first acquiring unit is configured to acquire data by executing a pulse sequence based on a first radio-frequency pulse transmission condition. The second acquiring unit is configured to acquire data by executing a pulse sequence based on a second radio-frequency pulse transmission condition that is different from the first radio-frequency pulse transmission condition. The combining unit is configured to perform a combining process either on the data acquired by the first acquiring unit and the data acquired by the second acquiring unit or on data obtained by reconstructing the data acquired by the first acquiring unit and data obtained by reconstructing the data acquired by the second acquiring unit.

As examples of MRI apparatuses according to exemplary embodiments, MRI apparatuses according to first, second, and third embodiments will be explained below.

First Embodiment

Figure 1:
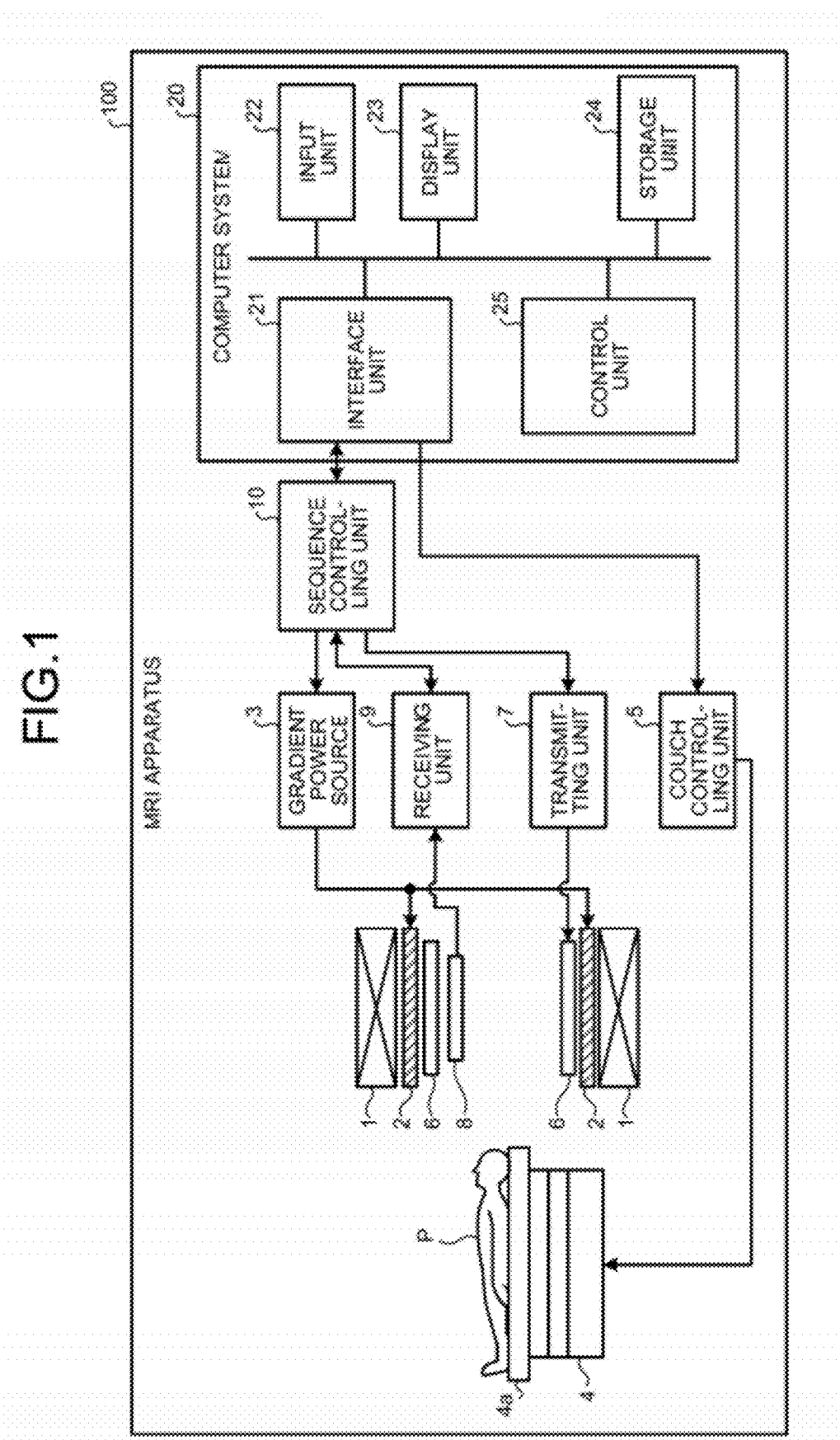
FIG. 1 is a diagram of an MRI apparatus according to a first embodiment.

First, a configuration of an MRI apparatus 100 according to a first embodiment will be explained with reference to FIG. 1. FIG. 1 is a diagram of the MRI apparatus 100 according to the first embodiment. As shown in FIG. 1, the MRI apparatus 100 according to the first embodiment includes, in particular: a magnetostatic field magnet 1, a gradient coil 2, a gradient power source 3, a couch 4, a couch controlling unit 5, a transmission coil 6, a transmitting unit 7, a receiving coil 8, a receiving unit 9, a sequence controlling unit 10, and a computer system 20.

The magnetostatic field magnet 1 is formed in the shape of a hollow circular cylinder and generates a uniform magnetostatic field in the space on the inside thereof. The magnetostatic field magnet 1 may be configured by using, for example, a permanent magnet, a superconductive magnet, or the like. The gradient coil 2 is formed in the shape of a hollow circular cylinder and generates a gradient magnetic field in the space on the inside thereof. More specifically, the gradient coil 2 is disposed on the inside of the magnetostatic field magnet 1 and generates the gradient magnetic field by receiving a supply of electric current from the gradient power source 3. The gradient power source 3 supplies the electric current to the gradient coil 2 according to pulse sequence execution data transmitted thereto from the sequence controlling unit 10.

The couch 4 includes a couchtop 4a on which a subject P is placed. While the subject P is placed thereon, the couchtop 4a is inserted into the hollow (i.e., an image taking aperture) of the gradient coil 2. Normally, the couch 4 is provided so that the longitudinal direction thereof extends parallel to the central axis of the magnetostatic field magnet 1. The couch controlling unit 5 drives the couch 4 so that the couchtop 4a moves in the longitudinal direction and in an up-and-down direction.

The transmission coil 6 generates an RF (B1) magnetic field. More specifically, the transmission coil 6 is disposed on the inside of the gradient coil 2 and generates the RF (B1) magnetic field by receiving a supply of an RF pulse from the transmitting unit 7. The transmitting unit 7 applies the RF pulse corresponding to a resonance frequency (a Larmor frequency) to the transmission coil 6, according to pulse sequence execution data transmitted thereto from the sequence controlling unit 10.

The receiving coil 8 receives a Magnetic Resonance (MR) echo signal. More specifically, the receiving coil 8 is disposed on the inside of the gradient coil 2 and receives the MR echo signal emitted from the subject P due to an influence of the radio-frequency magnetic field. Further, the receiving coil 8 outputs the received MR echo signal to the receiving unit 9. For example, the receiving coil 8 may be a receiving coil for the head of the subject, a receiving coil for the spine, or a receiving coil for the abdomen.

Based on the MR echo signal being output from the receiving coil 8, the receiving unit 9 generates MR echo signal data according to pulse sequence execution data transmitted thereto from the sequence controlling unit 10. More specifically, the receiving unit 9 generates the MR echo signal data by applying a digital conversion to the MR echo signal being output from the receiving coil 8 and transmits the generated MR echo signal data to the computer system 20 via the sequence controlling unit 10. The receiving unit 9 may be provided on the side where a gantry device is provided, the gantry device including the magnetostatic field magnet 1 and the gradient coil 2.

The sequence controlling unit 10 controls the gradient power source 3, the transmitting unit 7, and the receiving unit 9. More specifically, the sequence controlling unit 10 transmits the pulse sequence execution data transmitted thereto from the computer system 20, to the gradient power source 3, to the transmitting unit 7, and to the receiving unit 9.

The computer system 20 includes, in particular, an interface unit 21, an input unit 22, a display unit 23, a storage unit 24, and a control unit 25. The interface unit 21 is connected to the sequence controlling unit 10 and controls inputs and outputs of data that is transmitted and received between the sequence controlling unit 10 and the computer system 20. The input unit 22 receives an image-taking instruction and the like from an operator. For example, the input unit 22 may be configured by using any of the following: a pointing device such as a mouse and/or a trackball; a selecting device such as a mode changing switch; and an input device such as a keyboard. The display unit 23 displays a reconstructed image and the like. For example, the display unit 23 may be a display device such as a liquid crystal display monitor.

The storage unit 24 stores therein the reconstructed image and other data used in the MRI apparatus 100. For example, the storage unit 24 is configured by using a semiconductor memory element such as a Random Access Memory (RAM) or a flash memory, a hard disk, an optical disk, or the like.

The control unit 25 exercises overall control of the MRI apparatus 100 by controlling the functional units described above. For example, the control unit 25 may be an integrated circuit such as an Application Specific Integrated Circuit (ASIC) or a Field Programmable Gate Array (FPGA) or an electronic circuit such as a Central Processing Unit (CPU) or a Micro Processing Unit (MPU).

FIG. 2 is a diagram of the control unit 25 according to the first embodiment. As shown in FIG. 2, the control unit 25 according to the first embodiment includes, in particular, a first acquiring unit 25a, a second acquiring unit 25b, an image reconstructing unit 25c, and an image combining unit 25d.

The first acquiring unit 25a acquires data by executing a pulse sequence based on a first RF pulse transmission condition. More specifically, the first acquiring unit 25a transmits pulse sequence execution data for executing the pulse sequence based on the first RF pulse transmission condition to the gradient power source 3, the transmitting unit 7, and the receiving unit 9, via the sequence controlling unit 10. Subsequently, the first acquiring unit 25a receives MR echo signal data generated by the receiving unit 9 via the sequence controlling unit 10. Further, the first acquiring unit 25a sends the received MR echo signal data to the image reconstructing unit 25c.

The second acquiring unit 25b acquires data by executing a pulse sequence based on a second RF pulse transmission condition. More specifically, the second acquiring unit 25b transmits pulse sequence execution data for executing the pulse sequence based on the second RF pulse transmission condition to the gradient power source 3, the transmitting unit 7, and the receiving unit 9, via the sequence controlling unit 10. Subsequently, the second acquiring unit 25b receives MR echo signal data generated by the receiving unit 9 via the sequence controlling unit 10. Further, the second acquiring unit 25b sends the received MR echo signal data to the image reconstructing unit 25c.

In this situation, the first RF pulse transmission condition and the second RF pulse transmission condition are different from each other. In the first embodiment, the first RF pulse transmission condition and the second RF pulse transmission condition have mutually-different RF pulse transmission intensities. The pulse sequence execution data transmitted by the first acquiring unit 25a and the pulse sequence execution data transmitted by the second acquiring unit 25b are configured in such a manner that, for example, the transmission strength based on the second RF pulse transmission condition is uniformly higher than the transmission strength based on the first RF pulse transmission condition, over the entire slicing plane. For example, when a transmission strength is configured so as to be uniformly higher over the entire slicing plane, excitation flip angles in different parts on the inside of the subject uniformly become larger.

Alternatively, the pulse sequence execution data transmitted by the first acquiring unit 25a and the pulse sequence execution data transmitted by the second acquiring unit 25b are configured in such a manner that, for example, the transmission strength based on the second RF pulse transmission condition is uniformly lower than the transmission strength based on the first RF pulse transmission condition, over the entire slicing plane. For example, when a transmission strength is configured so as to be uniformly lower over the entire slicing plane, excitation flip angles in different parts on the inside of the subject uniformly become smaller. For instance, the pulse sequence execution data may be configured into the MRI apparatus 100 in advance or may be configured by receiving an input of parameters from the operator.

Many different types of pulse sequences can be used as the pulse sequences executed by the first acquiring unit 25a and the second acquiring unit 25b. Typical examples include pulse sequences that use a spin echo method, a fast spin echo method, and a Steady State Free Precession (SSFP) method. Further, the mode in which images are taken can be selected from a wide range of examples including a two-dimensional (2D) method, a three-dimensional (3D) method, a Cartesian method, and a Non-Cartesian method.

The image reconstructing unit 25c reconstructs an image by using the data acquired by the first acquiring unit 25a and the data acquired by the second acquiring unit 25b. More specifically, when having received the MR echo signal data from the first acquiring unit 25a, the image reconstructing unit 25c generates a first image by reconstructing the received MR echo signal data and sends the generated first image to the image combining unit 25d. Further, when having received the MR echo signal data from the second acquiring unit 25b, the image reconstructing unit 25c generates a second image by reconstructing the received MR echo signal data and sends the generated second image to the image combining unit 25d.

The image combining unit 25d performs a combining process on the images obtained through the reconstructing processes performed by the image reconstructing unit 25c. More specifically, when having received the first image and the second image from the image reconstructing unit 25c, the image combining unit 25d compares the signal intensities for each set of pixels that are in mutually the same spatial position, between the first image and the second image received. Further, by selecting the maximum value among the signal intensities, the image combining unit 25d performs the combining process. The combining process, however, is not limited to the method by which the maximum value among the signal intensities is selected. For example, a method by which the absolute values of the signal intensities are added together or a method by which a sum of squares is calculated may be used.

FIG. 3 is a flowchart of a processing procedure performed by the control unit 25 according to the first embodiment. In the first embodiment, it is assumed that the data acquiring process is performed twice, i.e., the data acquiring process performed by the first acquiring unit 25a and the data acquiring process performed by the second acquiring unit 25b. Accordingly, the process at steps S101 through S103 shown in FIG. 3 is repeatedly performed two times. However, as explained below, the MRI apparatus according to the exemplary embodiments is not limited to this example. The process at steps S101 through S103 shown in FIG. 3 may be repeatedly performed an arbitrary number of times determined in advance.

First, an imaging process performed by the MRI apparatus 100 is started when an operator such as a radiological technician or a medical doctor designates an imaging protocol. In this situation, for example, the operator designates the imaging protocol for executing a series of processes performed by the first acquiring unit 25a, the second acquiring unit 25b, the image reconstructing unit 25c, and the image combining unit 25d. The designated imaging protocol includes the first RF pulse transmission condition and the second RF pulse transmission condition. Also, the imaging protocol includes relevant information such as imaging time dependent on the first and the second RF pulse transmission conditions.

Subsequently, in the control unit 25, the first acquiring unit 25a sets the first RF pulse transmission condition (step S101). For example, let us discuss a situation in which an excitation flip angle $x°$ is set as the first RF pulse transmission condition in the imaging protocol. In that situation, the first acquiring unit 25a calculates pulse sequence execution data that allows the excitation flip angle to be $x°$ and transmits the calculated pulse sequence execution data to the gradient power source 3, the transmitting unit 7, and the receiving unit 9.

Subsequently, the first acquiring unit 25a acquires data (step S102). For example, the first acquiring unit 25a receives the MR echo signal data generated by the receiving unit 9 and sends the received MR echo signal data to the image reconstructing unit 25c. The units in which the data is acquired can be arbitrarily selected. For example, data corresponding to one series (e.g., 50 slices with the excitation flip angle of $x°$) may be acquired or data corresponding to one slice may be acquired.

The control unit 25 judges whether the data acquiring process based on the RF pulse transmission conditions included in the imaging protocol is finished (step S103). In the first embodiment, the imaging protocol also includes the second RF pulse transmission condition. Thus, the control unit 25 determines that the data acquiring process is not finished (step S103: No), and the second acquiring unit 25b sets the second RF pulse transmission condition (step S101). For example, let us assume that an excitation flip angle $y°$ is set as the second RF pulse transmission condition in the imaging protocol. In that situation, the second acquiring unit 25b calculates pulse sequence execution data that allows the excitation flip angle to be y° and transmits the calculated pulse sequence execution data to the gradient power source 3, the transmitting unit 7, and the receiving unit 9.

Subsequently, the second acquiring unit 25b acquires data (step S102). For example, the second acquiring unit 25b receives the MR echo signal data generated by the receiving unit 9 and sends the received MR echo signal data to the image reconstructing unit 25c. The units in which the data is acquired can be arbitrarily selected. For example, data corresponding to one series (e.g., 50 slices with the excitation flip angle of y°) may be acquired or data corresponding to one slice may be acquired.

Once again, the control unit 25 judges whether the data acquiring process based on the RF pulse transmission conditions included in the imaging protocol is finished (step S103). When it is determined that the data acquiring process is finished (step S103: Yes), the image reconstructing unit 25c subsequently reconstructs the data acquired by the first acquiring unit 25a and the data acquired by the second acquiring unit 25b (step S104).

The image reconstructing process performed by the image reconstructing unit 25c is not limited to the exemplary processing procedure in which the image reconstructing process is started after the data acquiring processes performed by both the first acquiring unit 25a and the second acquiring unit 25b are completed. For example, it is acceptable for the image reconstructing unit 25c to start reconstructing the data acquired by the first acquiring unit 25a immediately after the data acquiring process performed by the first acquiring unit 25a is completed, without waiting for the data acquiring process performed by the second acquiring unit 25b. As another example, it is acceptable for the image reconstructing unit 25c to perform the reconstructing process on the data acquired by the first acquiring unit 25a, in parallel with the data acquiring process performed by the second acquiring unit 25b. At the stage when the process at step S104 is completed, the reconstructing process of all the images required by the process performed by the image combining unit 25d is completed.

After that, the image combining unit 25d performs the combining process on the first image and the second image obtained as a result of the reconstructing process performed by the image reconstructing unit 25c (step S105). More specifically, the image combining unit 25d performs the combining process by comparing the signal intensities for each set of pixels that are in mutually the same spatial position between the first image and the second image and selecting the maximum value among the signal intensities.

Next, a technical significance of the combining process will be explained, with reference to FIG. 4. FIG. 4 is a drawing for explaining a technical significance of the combining process performed by the image combining unit 25d according to the first embodiment. When the horizontal axis expresses the "excitation flip angle", while the vertical axis expresses the "signal intensity", the signal intensity can be indicated by a curve for each tissue, as shown in FIG. 4, for example.

As explained above, the situation in which the transmission strength based on the second RF pulse transmission condition is arranged so as to be uniformly higher, over the entire slicing plane, than the transmission strength based on the first RF pulse transmission condition is equivalent to the situation where the excitation flip angle is arranged so as to be uniformly larger. In other words, the x's at the levels "$a_0$", "$a_1$", and "$a_2$" in FIG. 4 represent the fluctuation in the signal strength for a tissue "a" in the situation where the excitation flip angle gradually becomes larger. In this situation, for example, the signal intensity exhibits the maximum value at the $a_1$ level. Thus, it is most desirable to reconstruct an image by using the data acquired at this signal intensity, from the viewpoint of improving the quality of the image.

When the RF (B1) strength levels are inhomogeneous on the inside of the subject, however, even if the signal intensity is at the $a_1$ level for a certain pixel, the signal intensity may be at the $a_0$ level or at the $a_2$ level for other pixels. To cope with this situation, the MRI apparatus 100 according to the first embodiment is configured so as to perform the pulse sequence twice in such a manner that the excitation flip angle uniformly becomes larger. As a result, a situation occurs in which, for example, the signal intensity for a pixel P1 is at the $a_0$ level the first time and is at the $a_1$ level the second time, whereas the signal intensity for a pixel P2 is at the $a_1$ level the first time and is at the $a_2$ level the second time.

In this situation, if the signal intensities are compared for each set of pixels that are in mutually the same spatial position so that the maximum value among the signal intensities is selected, the data acquired the second time, which is the data with the signal intensity at the $a_1$ level, is selected for the pixel P1, whereas the data acquired the first time, which is the data with the signal intensity at the $a_1$ level, is selected for the pixel P2. Accordingly, the image combined by the image combining unit 25d is made up of a set of pixels obtained by selecting the maximum value among the signal intensities. The quality of the entire image is therefore improved. Further, the contrast of the image corresponds to, for example, a difference between the signal intensity for the tissue "a" and the signal intensity for a tissue "b". Thus, when the maximum value among the signal intensities is selected for each of the tissues, the contrast, which corresponds to the difference in the signal intensity from those of the other tissues, is also improved accordingly.

As mentioned above, the combining process is not limited to the method by which the maximum value among the signal intensities is selected. For example, a method by which the absolute values of the signal intensities are added together or a method by which a sum of squares is calculated may be used. According to the latter methods, however, the effect of reducing degradations of the image is considered to be slightly lower than when the method by which the maximum value is selected is used. In other words, adding together the absolute values of the signal intensities is, in fact, equivalent to calculating the average of the two signal intensities obtained in the two-time data acquiring processes. For this reason, the image combined by the image combining unit 25d is made up of a set of pixels representing the average values of the signal intensities. Thus, although the quality of the entire image is improved, the effect of reducing degradations of the image is considered to be slightly lower than when the method by which the maximum value is selected is used. Further, calculating a sum of squares is to emphasize pixel values having higher levels of brightness. Thus, the quality of the entire image is improved.

When the method by which the maximum value is selected is used, however, the S/N ratio (the ratio between the signal and the noise) is not expected to be improved by the combining of the plurality of images, and the S/N ratio remains at the level corresponding to one image. In contrast, when the method by which the absolute values are added together or the method by which a sum of squares is calculated is used, the S/N ratio is improved according to the number of images combined.

Figure 5A:
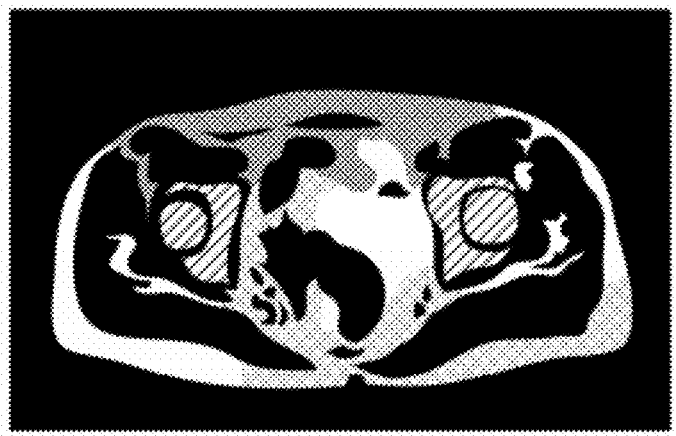
FIG. 5A is a drawing of an example implemented by using a fast spin echo method with a magnetostatic field strength of 3 T.
Figure 5B:
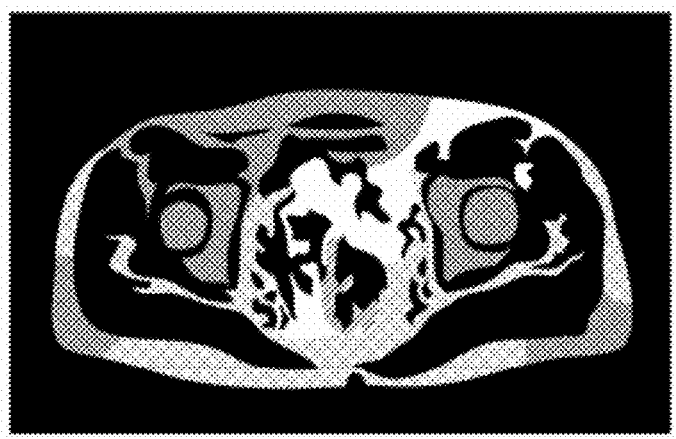
FIG. 5B is another drawing of the example implemented by using the fast spin echo method with the magnetostatic field strength of 3 T.
Figure 5C:
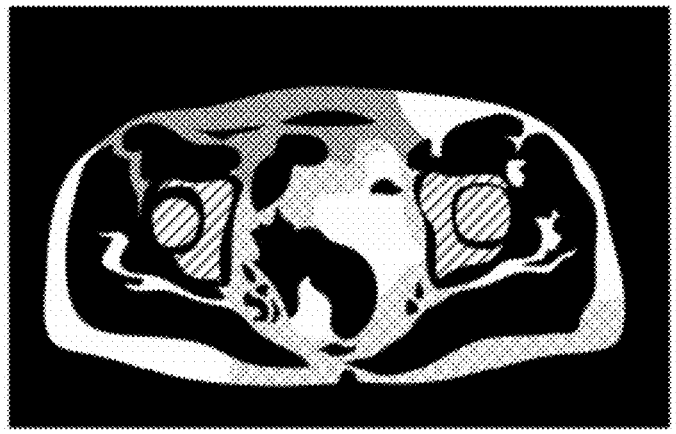
FIG. 5C is yet another drawing of the example implemented by using the fast spin echo method with the magnetostatic field strength of 3 T.
Figure 5D:
FIG. 5D is yet another drawing of the example implemented by using the fast spin echo method with the magnetostatic field strength of 3 T.

FIGS. 5A to 5D are drawings of an example implemented by using a fast spin echo method with a magnetostatic field strength of 3 T. In this example, conditions for a T2-weighted image are used. FIG. 5A depicts an image obtained by reconstructing data acquired by using an RF pulse transmission condition where the transmission strength is 50 decibels (dB). Due to inhomogeneity of the RF (B1) strength levels, some areas in which the signal intensities are lower are observed near the frontal wall of the abdomen and near the back of the subject. Further, FIG. 5B depicts an image obtained by reconstructing data acquired by using an RF pulse transmission condition where the transmission strength is 54 decibels. Due to inhomogeneity of the RF (B1) strength levels, some areas in which the signal intensities are lower are observed on the left side and the right side. FIG. 5C depicts an image combined by the image combining unit 25d. In the image shown in FIG. 5C, the lowering of the signal intensities observed in the images in FIGS. 5A and 5B is improved. It is clear that the areas in which the signal lengths are lower are reduced and that the contrast is improved. FIG. 5D depicts a difference image between the image depicted in FIG. 5C and the image depicted in FIG. 5A, for the sake of convenience in the explanation.

The first embodiment is explained on the assumption that the data acquiring process is performed twice, i.e., the data acquiring process performed by the first acquiring unit 25a and the data acquiring process performed by the second acquiring unit 25b; however, the MRI apparatus according to the exemplary embodiments is not limited to this example. The data acquiring process may be performed an arbitrary number of times determined in advance. However, considering the imaging time becoming longer, it is preferable to perform the data acquiring process twice or three times.

Figure 6A:
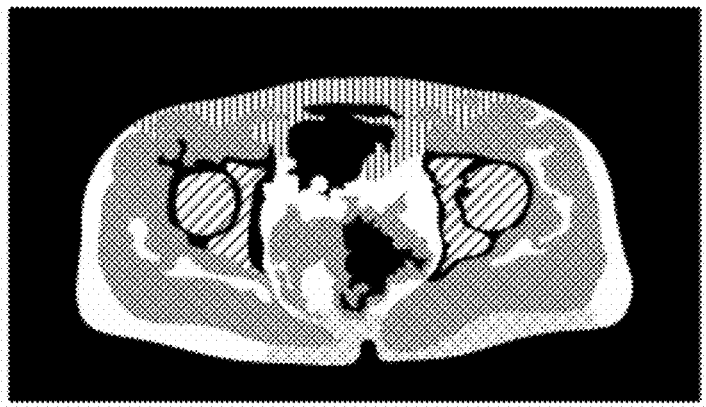
FIG. 6A is a drawing of an example in which data is acquired three times by using a spin echo method with a magnetostatic field strength of 3 T.
Figure 6B:
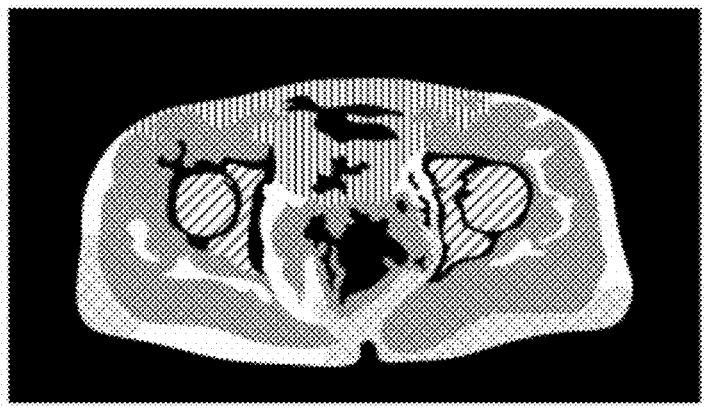
FIG. 6B is another drawing of the example in which the data is acquired three times by using the spin echo method with the magnetostatic field strength of 3 T.
Figure 6C:
FIG. 6C is yet another drawing of the example in which the data is acquired three times by using the spin echo method with the magnetostatic field strength of 3 T.
Figure 6D:
FIG. 6D is yet another drawing of the example in which the data is acquired three times by using the spin echo method with the magnetostatic field strength of 3 T.

FIGS. 6A to 6D are drawings of an example in which data is acquired three times by using a spin echo method with a magnetostatic field strength of 3 T. In this example, conditions for a T1-weighted image are used. FIG. 6A depicts an image obtained by reconstructing data acquired by using an RF pulse transmission condition having a reference transmission strength. Due to inhomogeneity of the RF (B1) strength levels, some areas in which the signal intensities are lower are observed near the frontal wall of the abdomen and the like. Further, FIG. 6B depicts an image obtained by reconstructing data acquired by using an RF pulse transmission condition where the transmission strength is equal to "the reference transmission strength"+2 decibels. Due to inhomogeneity of the RF (B1) strength levels, some areas in which the signal intensities are lower are observed near the back of the subject and the like. FIG. 6C depicts an image obtained by reconstructing data acquired by using an RF pulse transmission condition where the transmission strength is equal to "the reference transmission strength"+4 decibels. Due to inhomogeneity of the RF (B1) strength levels, some areas in which the signal intensities are lower are observed on the left side and the right side, and the like. FIG. 6D depicts an image combined by the image combining unit 25d. In the image shown in FIG. 6D, the lowering of the signal intensities observed in the images shown in FIGS. 6A, 6B, and 6C is improved. It is clear that the areas in which the signal intensities are lower are reduced and that the contrast is improved.

As explained above, the MRI apparatus 100 according to the first embodiment executes the pulse sequence based on the first RF pulse transmission condition, and also, executes the pulse sequence based on the second RF pulse transmission condition having a different transmission strength from that of the first RF pulse transmission condition, so as to acquire data with each of the pulse sequences. Further, the MRI apparatus 100 generates the first image by reconstructing the data acquired by using the first RF pulse transmission condition, and also, generates the second image by reconstructing the data acquired by using the second RF pulse transmission condition. Subsequently, the MRI apparatus 100 performs the combining process by comparing the signal intensities for each set of pixels that are in mutually the same spatial position between the first image and the second image and selecting the maximum value among the signal intensities. With these arrangements, according to the first embodiment, it is possible to reduce the degradations of the image caused by the inhomogeneity of the RF (B1) strength levels.

The MRI apparatus 100 according to the first embodiment may be used together with a technique that improves inhomogeneity of the RF (B1) strength levels by using hardware or a technique that improves inhomogeneity of the RF (B1) strength levels by improving waveforms of the RF pulse.

Further, in the first embodiment, the method is explained by which the data acquiring process is performed by the second acquiring unit 25b after the data acquiring process performed by the first acquiring unit 25a is finished; however, the exemplary embodiments are not limited to this example. Another arrangement is acceptable in which the data acquiring process by the first acquiring unit 25a and the data acquiring process by the second acquiring unit 25b are performed alternately.

Figure 7A:
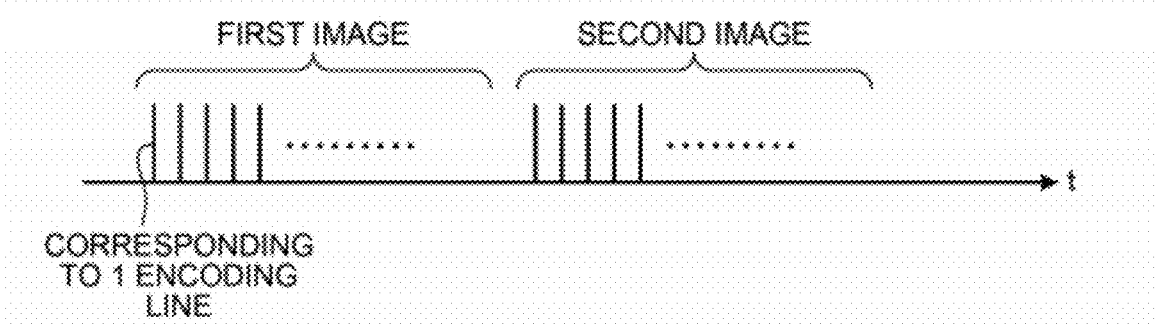
FIG. 7A is a drawing for explaining a modification example of a data acquiring process according to the first embodiment.
Figure 7B:
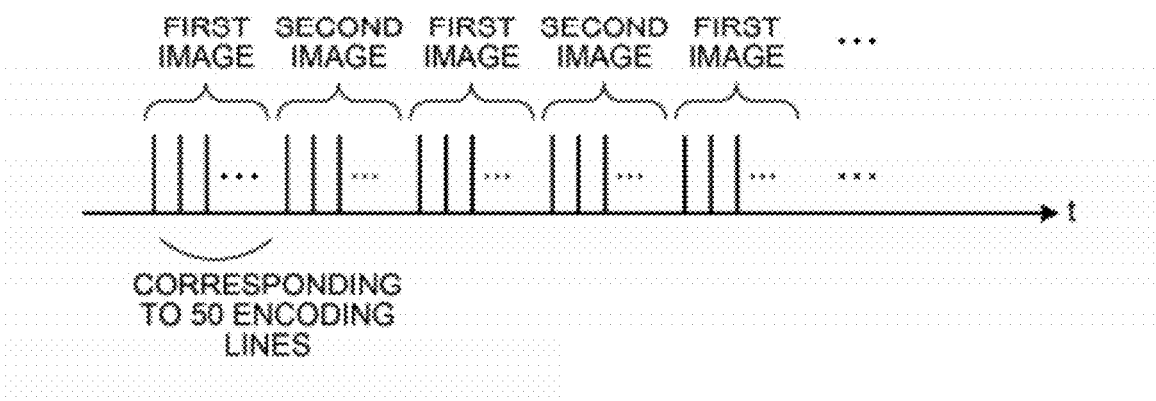
FIG. 7B is another drawing for explaining the modification example of the data acquiring process according to the first embodiment.

FIGS. 7A and 7B are drawings for explaining a modification example of the first embodiment. FIG. 7A depicts the method explained in the first embodiment, whereas FIG. 7B depicts a modification example. As shown in FIG. 7A, in the first embodiment, the MRI apparatus 100 acquires, for example, the data used for reconstructing the second image, after acquiring the data used for reconstructing the first image. In that situation, there is a timing difference between the data acquired for the first image and the data acquired for the second image. For this reason, if any motions such as respiratory motions occur in the subject, for example, a positional shift occurs between the first image and the second image, and the combined image will be affected by the positional shift.

To cope with this situation, according to the present modification example, for instance, the MRI apparatus 100 alternately performs, as shown in FIG. 7B, the process to acquire a part of the data used for reconstructing the first image and the process to acquire a part of the data used for reconstructing the second image. For example, the MRI apparatus 100 performs the acquiring processes alternately each of which corresponds to 50 encoding lines.

In this situation, the data for the first image and the data for the second image are acquired during substantially the same period. As a result, even if a motion such as a respiratory motion occurs in the subject, the motion is equally reflected in both the first image and the second image. As a result, the combined image is less affected. The units in which the data is acquired shown in FIGS. 7A and 7B are only examples. As mentioned above, the units in which the data is acquired may be arbitrarily selected.

Further, in the first embodiment, the method is explained by which the data corresponding to all the encoding lines is acquired as the data for the first image and as the data for the second image; however, the exemplary embodiments are not limited to this example. Another method is acceptable by which only a part of the data is acquired as the data for one of the images, so that the data in the part that is not acquired is obtained by either copying or estimating from the data for the other image. FIGS. 8A to 8D are drawings for explaining modification examples of the first embodiment. In the following sections, first, second, third, and fourth modification examples will be explained, as modification examples of the first embodiment.

First Modification Example

In the first modification example, the first acquiring unit 25a acquires data in the entirety of a k space, whereas the second acquiring unit 25b acquires data in a partial region of the k space. The image reconstructing unit 25c supplements the data in the region from which no data is acquired by the second acquiring unit 25b, by performing a copying process based on the data acquired by the first acquiring unit 25a.

Figure 8A:
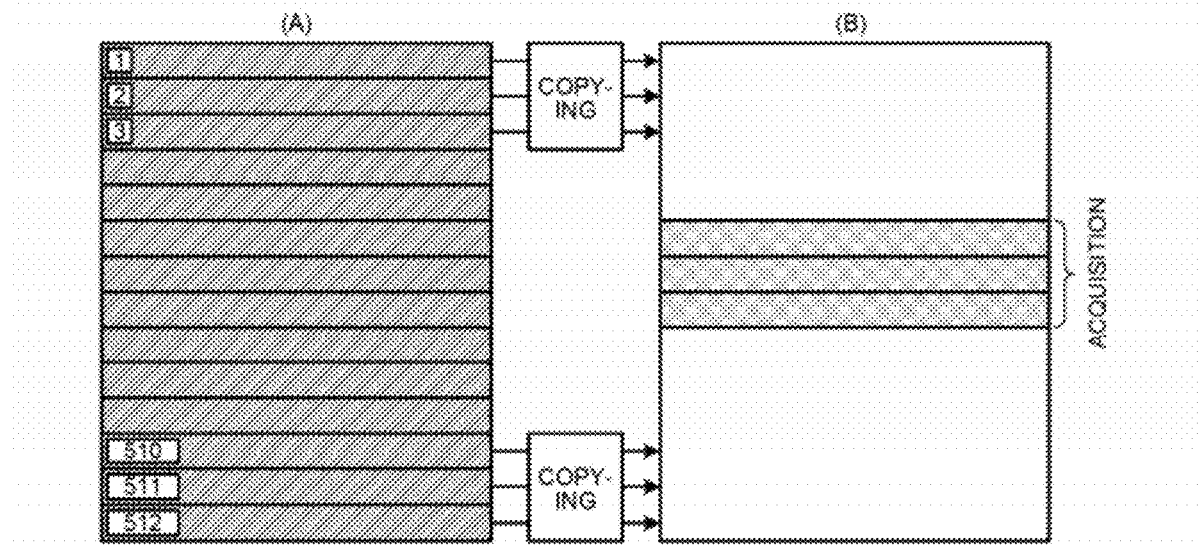
FIG. 8A is a drawing for explaining another modification example of the data acquiring process according to the first embodiment.

In FIG. 8A, (A) depicts the data acquired by the first acquiring unit 25a, whereas (B) depicts the data acquired by the second acquiring unit 25b. As shown in FIG. 8A, the first acquiring unit 25a acquires the data corresponding to all the encoding lines, as the data for the first image. In contrast, the second acquiring unit 25b acquires only a part of the data, as the data for the second image. For example, the second acquiring unit 25b acquires data near the center of the k space, i.e., only the data in a low-frequency region (corresponding to, for example, 100 encoding lines). The data near the center of the k space includes information regarding, for example, a rough representation of the signal distribution in the image, the contrast, and inhomogeneity of the RF (B1) strength levels.

Further, to reconstruct the data for the second image, the image reconstructing unit 25c copies the data for the first image, with respect to the region from which no data was acquired by the second acquiring unit 25b. For the sake of convenience in the explanation, arrows indicating the copying of encoding lines 1-3 and 510-512 are shown in FIG. 8A; however, the copying process is performed in the same manner also for the other encoding lines of which the data was not acquired.

As explained above, the data near the center of the k space includes the information regarding, for example, a rough representation of the signal distribution in the image, the contrast, and inhomogeneity of the RF (B1) strength levels. Thus, as long as at least the data near the center is acquired as the data for the second image, the image reconstructing unit 25c is able to reconstruct the second image by copying the data for the first image for the other regions.

By using this method, it is possible to reduce the amount of acquired data and to shorten the imaging time. It should be noted that another method is acceptable by which the data corresponding to all the encoding lines is acquired as the data for the second image, while only a part of the data is acquired as the data for the first image.

Second Modification Example

In the second modification example, the first acquiring unit 25a acquires the data in the entirety of the k space, whereas the second acquiring unit 25b acquires data in a partial region of the k space. The image reconstructing unit 25c supplements the data in the region from which no data is acquired by the second acquiring unit 25b, by performing an estimating process based on the data acquired by the first acquiring unit 25a.

Figure 8B:
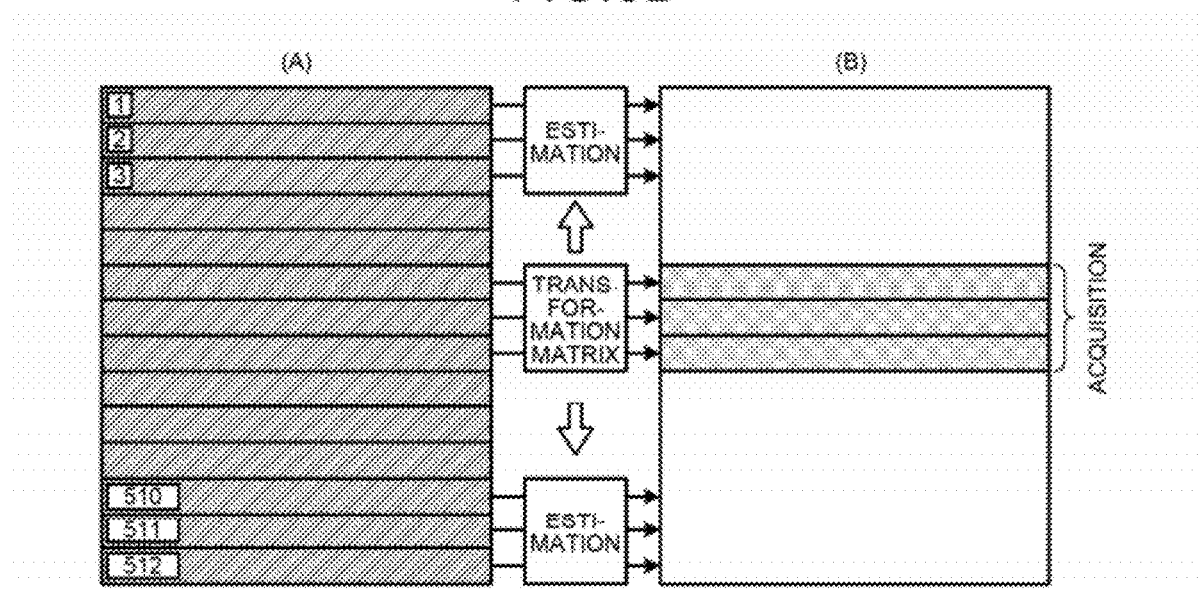
FIG. 8B is a drawing for explaining yet another modification example of the data acquiring process according to the first embodiment.

In FIG. 8B, (A) depicts the data acquired by the first acquiring unit 25a, whereas (B) depicts the data acquired by the second acquiring unit 25b. As shown in FIG. 8B, like in the first modification example, the first acquiring unit 25a acquires the data corresponding to all the encoding lines, as the data for the first image. In contrast, the second acquiring unit 25b acquires only a part of the data, as the data for the second image.

In this situation, while using the data acquired by the first acquiring unit 25a and the data acquired by the second acquiring unit 25b, the image reconstructing unit 25c according to the second modification example calculates a transformation matrix W used for estimating the data acquired by the second acquiring unit 25b, based on the data acquired by the first acquiring unit 25a.

More specifically, data $S_j$ acquired by the second acquiring unit 25b is known, and also, data $S_i$ acquired by the first acquiring unit 25a is also known. Accordingly, it is possible to calculate the transformation matrix W (a matrix of $w_i$) used for estimating the data $S_j$ acquired by the second acquiring unit 25b, based on the data $S_i$ acquired by the first acquiring unit 25a, on the basis of a relationship shown in Expression (1). In Expression (1), $w_i$ denotes a weight.

$$\Sigma w_i S_i = S_j \quad (1)$$

Further, to reconstruct the data for the second image, the image reconstructing unit 25c estimates the data in the region from which no data was acquired by the second acquiring unit 25b, by performing the calculation in Expression (1), which uses the data acquired by the first acquiring unit 25a and the transformation matrix W, with respect to the data in the region from which no data was acquired by the second acquiring unit 25b. For the sake of convenience in the explanation, arrows estimating the encoding lines 1-3 and 510-512 are shown in FIG. 8B; however, the estimating process is performed in the same manner also for the other encoding lines of which the data was not acquired. Further, as long as at least a part of the data is acquired as the data for the second image, the image reconstructing unit 25c is able to reconstruct the second image by estimating the data for the other regions from the data for the first image. Furthermore, if a plurality of receiving coils is installed, Expression (1) may express a linear combination among the plurality of coils. More specifically, it is possible to calculate a transformation matrix W (a matrix of $w_{i,m,n}$) used for estimating data $S_{j,n}$ acquired with a receiving coil n by the second acquiring unit 25b, based on data $S_{i,m}$ acquired with a receiving coil m by the first acquiring unit 25a.

$$\Sigma w_{i,m,n} S_{i,m} = S_{j,n} \quad (1)'$$

By using this method, it is possible to reduce the amount of acquired data and to shorten the imaging time. It should be noted that another method is acceptable by which the data corresponding to all the encoding lines is acquired as the data for the second image, while only a part of the data is acquired as the data for the first image.

Third Modification Example

In the third modification example, the first acquiring unit 25a acquires the data in the entirety of the k space while thinning out the data, whereas the second acquiring unit 25b acquires data in a partial region of the k space, while thinning out the data. The image reconstructing unit 25c supplements the data thinned by the first acquiring unit 25a, by performing an estimating process while using a linear combination of sensitivity distributions of the coils. Also, the image reconstructing unit 25c supplements the data in the region from which no data is acquired by the second acquiring unit 25b and the data thinned by the second acquiring unit 25b, by performing an estimating process based on the data acquired by the first acquiring unit 25a. Alternatively, it is acceptable to supplement the data by performing copying processes, instead of the estimating processes.

Figure 8C:
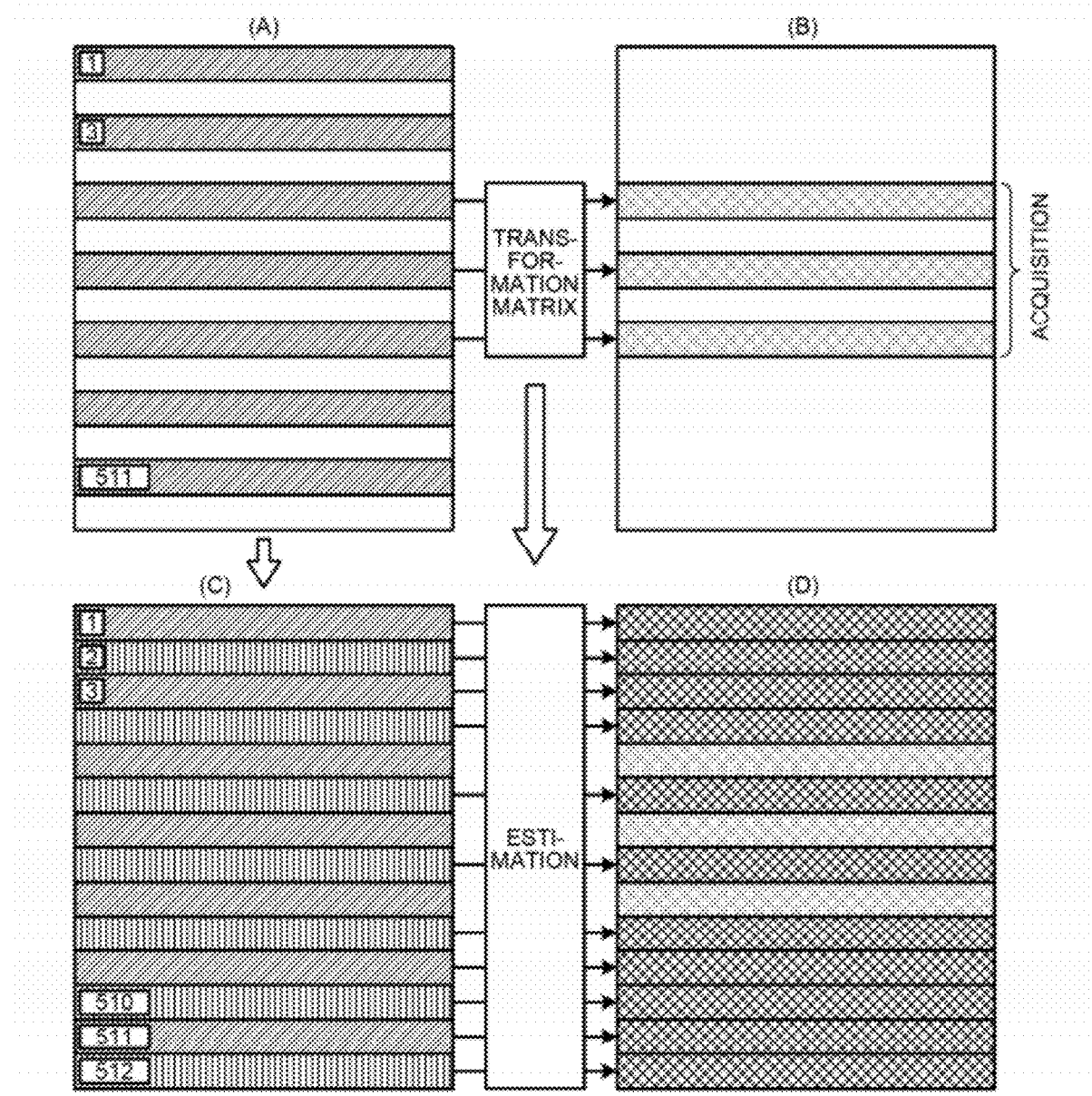
FIG. 8C is a drawing for explaining yet another modification example of the data acquiring process according to the first embodiment.

In FIG. 8C, (A) depicts the data acquired by the first acquiring unit 25a, whereas (B) depicts the data acquired by the second acquiring unit 25b. Further, (C) depicts the data for the first image generated by performing an estimating process based on the data depicted in (A). (D) depicts the data for the second image generated by performing an estimating process based on the data depicted in (C).

As shown in FIG. 8C, the first acquiring unit 25a acquires the data for the first image, while thinning out the data. For example, the first acquiring unit 25a acquires the data while thinning out the data by half. In contrast, the second acquiring unit 25b acquires only a part of the data as the data for the second image. For example, the second acquiring unit 25b acquires data near the center of the k space, i.e., only the data in a low-frequency region.

Subsequently, the image reconstructing unit 25c according to the third modification example estimates, in the k space, the thinned-out data by using a linear combination of the acquired data, while using the signals from the coils. In other words, based on the data depicted in (A), the image reconstructing unit 25c estimates the thinned-out data by using a relationship where harmonic data generated with the linear combination of the sensitivity distributions of the coils is analogous to phase encoded data, and the image reconstructing unit 25c is thus able to generate the complete data as shown in (C).

Further, like in the second modification example, while using the data acquired by the first acquiring unit 25a and the data acquired by the second acquiring unit 25b, the image reconstructing unit 25c calculates the transformation matrix W used for estimating the data acquired by the second acquiring unit 25b, based on the data acquired by the first acquiring unit 25a.

Further, the image reconstructing unit 25c estimates the data in the region from which no data was acquired by the second acquiring unit 25b, by performing the calculation in Expression (1) or Expression (1)' that uses the data for the first image, which is the complete data (the data depicted in (C)), and the transformation matrix W. In this manner, the image reconstructing unit 25c generates the complete data as shown in (D), from the data shown in (C).

By using this method, it is possible to reduce the amount of acquired data and to shorten the imaging time. It should be noted that another method is acceptable by which the data for the second image is acquired while being thinned out, whereas only a part of the data is acquired as the data for the first image.

Fourth Modification Example

In the fourth modification example, the first acquiring unit 25a acquires the data in the entirety of the k space while thinning out the data, whereas the second acquiring unit 25b acquires data in a partial region of the k space, while thinning out the data. The image reconstructing unit 25c supplements the data in the region from which no data is acquired by the second acquiring unit 25b, by performing an estimating process based on the data acquired by the first acquiring unit 25a. Also, the image reconstructing unit 25c supplements the data thinned by the first acquiring unit 25a and the second acquiring unit 25b, by performing an estimating process while using a linear combination of the sensitivity distributions of the coils. Alternatively, it is acceptable to supplement the data by performing copying processes, instead of the estimating processes.

Figure 8D:
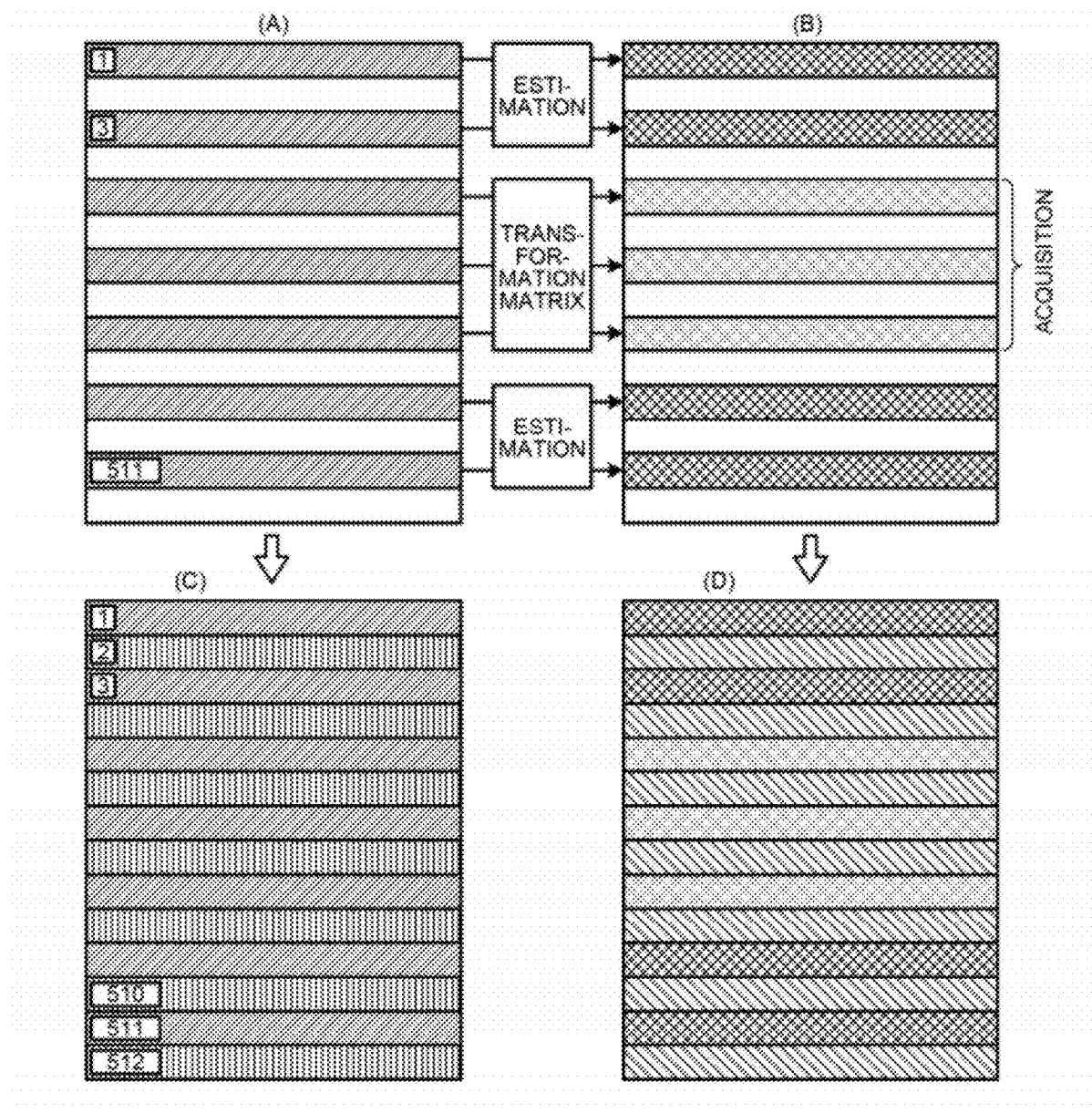
FIG. 8D is a drawing for explaining yet another modification example of the data acquiring process according to the first embodiment.

In FIG. 8D, (A) depicts the data acquired by the first acquiring unit 25a, whereas (B) depicts the data acquired by the second acquiring unit 25b and the data estimated based on the data acquired by the first acquiring unit 25a. Further, (C) depicts the data for the first image generated by performing an estimating process based on the data depicted in (A). (D) depicts the data for the second image generated by performing an estimating process based on the data depicted in (B).

As shown in FIG. 8D, the first acquiring unit 25a acquires the data for the first image, while thinning out the data. For example, the first acquiring unit 25a acquires the data while thinning out the data by half. In contrast, the second acquiring unit 25b acquires only a part of the data as the data for the second image. For example, the second acquiring unit 25b acquires data near the center of the k space, i.e., only the data in a low-frequency region.

First, like in the second modification example, while using the data acquired by the first acquiring unit 25a and the data acquired by the second acquiring unit 25b, the image reconstructing unit 25c according to the fourth modification example calculates the transformation matrix W used for estimating the data acquired by the second acquiring unit 25b, based on the data acquired by the first acquiring unit 25a.

Further, the image reconstructing unit 25c estimates the data in the region from which no data was acquired by the second acquiring unit 25b by performing the calculation in Expression (1) that uses the data for the first image, which is the thinned data (the data depicted in (A)), and the transformation matrix W. In this manner, the image reconstructing unit 25c generates the data shown in (B), from the data shown in (A). In the fourth modification example, because the data on which the estimation is based is the thinned data, the data depicted in (B) estimated from the data depicted in (A) is also thinned data.

Further, the image reconstructing unit 25c according to the fourth modification example estimates the thinned-out data based on the data depicted in (A) and the depicted in (B), so as to generate the complete data as depicted in (C) and the complete data as depicted in (D), respectively. These estimating processes are performed by using a linear combination of the data from the coils, like in the third modification example.

By using this method, it is possible to reduce the amount of acquired data and to shorten the imaging time. It should be noted that another method is acceptable by which the data for the second image is acquired while being thinned out, whereas only a part of the data is acquired as the data for the first image. With regard to the data amounts, a characteristic that is common to the third modification example and the fourth modification example is that the amount of acquired data is different between the data for the first image and the data for the second image. In the examples shown in FIGS. 8A to 8D, the amount of data acquired as the data for the second image is smaller than the amount of data acquired as the data for the first image. In relation to this, it is possible to set, relatively freely, the proportion by which the imaging time is shortened. Thus, it is possible to determine an image taking schedule while taking into account the effect of reducing unevenness in the brightness and the S/N ratio of the image.

Second Embodiment

Next, the MRI apparatus 100 according to a second embodiment will be explained, with reference to FIGS. 9 to 11. The MRI apparatus 100 according to the second embodiment has a similar configuration to that of the MRI apparatus 100 according to the first embodiment. Like the control unit 25 according to the first embodiment, the control unit 25 according to the second embodiment includes, in particular, the first acquiring unit 25a, the second acquiring unit 25b, the image reconstructing unit 25c, and the image combining unit 25d.

It should be noted, however, that the first acquiring unit 25a according to the second embodiment controls a phase encoding amount in such a manner that the acquired data corresponds to odd-numbered echo positions in the k space. Further, the second acquiring unit 25b according to the second embodiment controls a phase encoding amount in such a manner that the acquired data corresponds to even-numbered echo positions in the k space. Further, the image reconstructing unit 25c according to the second embodiment reconstructs an image by treating the data acquired by the first acquiring unit 25a as data corresponding to the odd-numbered echo positions in the k space and treating the data acquired by the second acquiring unit 25b as data corresponding to the even-numbered echo positions in the k space.

FIG. 9A is a drawing for explaining a data acquiring process according to the second embodiment. As shown in (A) in FIG. 9A, for example, the first acquiring unit 25a according to the second embodiment controls the phase encoding amount in such a manner that the acquired data corresponds to the odd-numbered echo positions in the k space. In this situation, an acquisition Field Of View (FOV) in the phase encoding direction is arranged to be twice as large as an imaging FOV. Further, as shown in (B) in FIG. 9A, for example, the second acquiring unit 25b according to the second embodiment controls the phase encoding amount in such a manner that the acquired data corresponds to the even-numbered echo positions in the k space. In this situation also, the acquisition FOV in the phase encoding direction is arranged to be twice as large as the imaging FOV.

Subsequently, as shown in (C) in FIG. 9A, for example, the image reconstructing unit 25c according to the second embodiment reconstructs the image by treating the data acquired by the first acquiring unit 25a as the data corresponding to the odd-numbered echo positions in the k space and treating the data acquired by the second acquiring unit 25b as the data corresponding to the even-numbered echo positions in the k space. In this situation, it is desirable to configure the image reconstructing unit 25c so as to shift the position of the center for the imaging process in the phase encoding direction during the data acquiring process by an amount corresponding to a half of the imaging FOV.

The data acquiring process according to the second embodiment may be performed by using the method by which, like in the modification example explained in the first embodiment for example, only a part of the data is acquired as the data for one of the images, whereas the part from which no data is acquired is estimated based on the data for the other image. FIG. 9B is a drawing for explaining a modification example of the data acquiring process according to the second embodiment.

In the modification example of the second embodiment, one of the first acquiring unit 25a and the second acquiring unit 25b acquires the data in the entirety of the k space, whereas the other of the acquiring units acquires the data in a partial region of the k space. The image reconstructing unit 25c supplements the data in the region from which no data is acquired by the other of the first acquiring unit 25a and the second acquiring unit 25b that acquired the data in the partial region of the k space, by performing an estimating process based on the data acquired the one of the first acquiring unit 25a and the second acquiring unit 25b that acquired the data in the entirety of the k space. Alternatively, it is acceptable to supplement the data by performing a copying process, instead of the estimating process. Further, in the following sections, the example is explained in which the first acquiring unit 25a controls the phase encoding amount in such a manner that the acquired data corresponds to the odd-numbered echo positions, whereas the second acquiring unit 25b controls the phase encoding amount in such a manner that the acquired data corresponds to the even-numbered echo positions; however, the opposite situation is also applicable.

As shown in (A) in FIG. 9B, for example, the first acquiring unit 25a according to a modification example of the second embodiment controls the phase encoding amount in such a manner that the acquired data corresponds to the odd-numbered echo positions in the k space. In contrast, as shown in (B) in FIG. 9B, the second acquiring unit 25b according to the modification example of the second embodiment acquires the data corresponding to the even-numbered echo positions in the k space only from an area near the center of the k space.

Subsequently, like in the second modification example of the first embodiment and so on, while using the data acquired by the first acquiring unit 25a and the data acquired by the second acquiring unit 25b, the image reconstructing unit 25c according to the modification example of the second embodiment calculates the transformation matrix W used for estimating the data acquired by the second acquiring unit 25b based on the data acquired by the first acquiring unit 25a. Further, with respect to the region from which no data was acquired by the second acquiring unit 25b, the image reconstructing unit 25c estimates the data in the region from which no data was acquired by the second acquiring unit 25b (however, the data corresponding to the even-numbered echo positions in the k space), by performing the calculation in Expression (1) that uses the data acquired by the first acquiring unit 25a and the transformation matrix W. For example, the image reconstructing unit 25c generates data shown in (D).

After that, as shown in (E) in FIG. 9B for example, the image reconstructing unit 25c according to the second embodiment reconstructs an image by treating the data (see (C)) acquired by the first acquiring unit 25a as the data corresponding to the odd-numbered echo positions in the k space and treating the data shown in (D) as the data corresponding to the even-numbered echo positions in the k space.

Figure 10A:
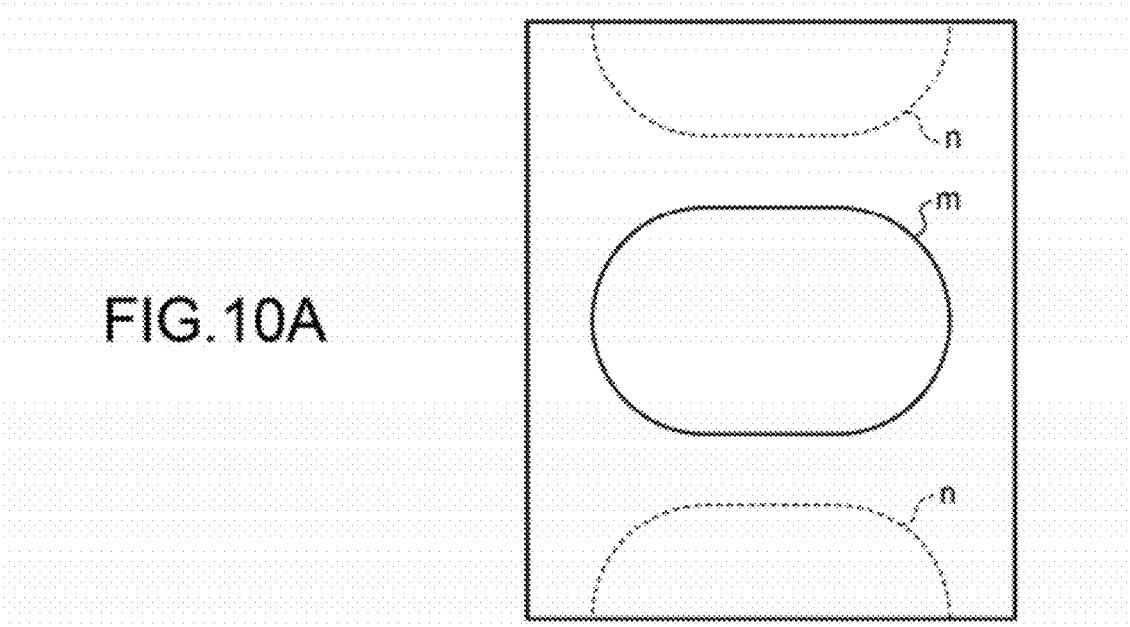
FIG. 10A is a drawing for explaining an image reconstructing process according to the second embodiment.
Figure 10B:
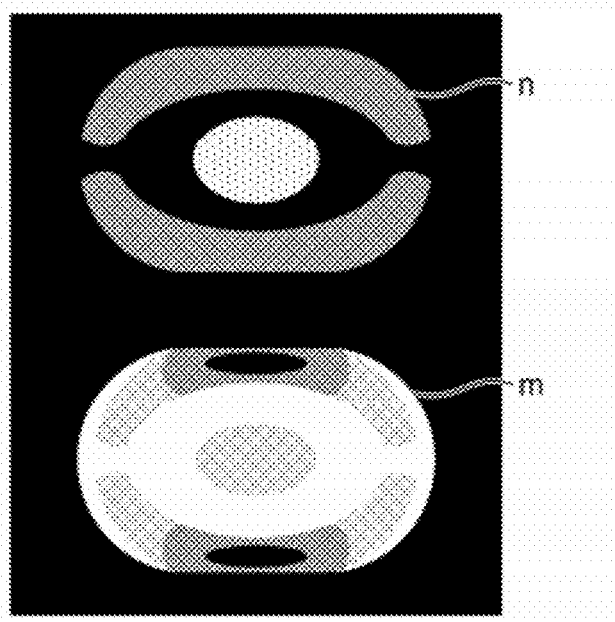
FIG. 10B is another drawing for explaining the image reconstructing process according to the second embodiment.
Figure 10C:
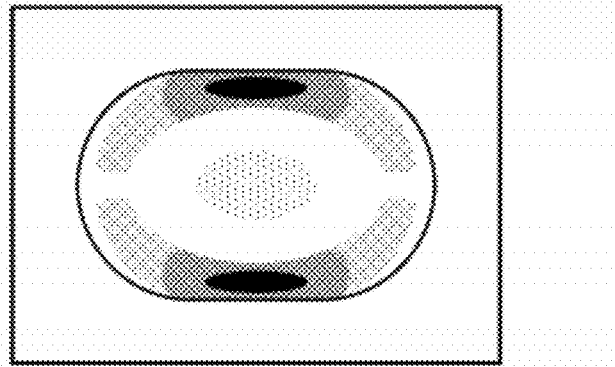
FIG. 10C is another drawing for explaining the image reconstructing process according to the second embodiment.

FIGS. 10A to 10C are drawings for explaining an image reconstructing process according to the second embodiment. FIG. 10A depicts an image reconstructed in a situation where the position of the center of the imaging process is not shifted. As explained later, the image reconstructing unit 25c according to the second embodiment reconstructs two split pictures within one image as a result of the reconstructing process. However, as shown in FIG. 10A, when the position of the center of the imaging process is not shifted, one of the two split pictures (i.e., a picture n) is positioned at the edges of the image, which is not desirable. To cope with this situation, the image reconstructing unit 25c according to the second embodiment shifts the position of the center of the imaging process by an amount corresponding to a half of the imaging FOV so as to obtain, as a result of the reconstructing process, an image as shown in FIG. 10B.

Next, the image shown in FIG. 10B will be explained. As shown in FIG. 10B, the image reconstructing unit 25c according to the second embodiment reconstructs two split pictures within one image, as a result of the reconstructing process. The picture m corresponds to a picture reconstructed by using, for each of the pixels, the average of the signal intensity of the data acquired by using the first RF pulse transmission condition and the signal intensity of the data acquired by using the second RF pulse transmission condition. For example, with reference to FIG. 4, the picture m corresponds to a picture reconstructed by using the average of the level "$a_0$" and the level "$a_1$" shown with the x's.

In contrast, the picture n corresponds to a picture reconstructed by using, for each of the pixels, the difference between the signal intensity of the data acquired by using the first RF pulse transmission condition and the signal intensity of the data acquired by using the second RF pulse transmission condition. For example, with reference to FIG. 4, the picture n corresponds to a picture reconstructed by using the difference of the level "$a_0$" and the level "$a_1$" shown with the x's.

As a result of the reconstructing process performed in this manner, the image reconstructing unit 25c according to the second embodiment reconstructs the two split pictures within the one image, and the image combining unit 25d according to the second embodiment performs a combining process on the two split pictures. For example, the image combining unit 25d performs an adding process on the pictures m and n shown in FIG. 10B by using the absolute values for each of the pixels. As a result, the image combining unit 25d generates, as shown in FIG. 10C for example, an image corresponding to the imaging FOV (i.e., one picture within one image).

The images shown in FIGS. 10A, 10B, and 10C are examples in which conditions for a T2-weighted image are used, while the magnetostatic field strength is 3 T and a fast spin echo method is used. The first RF pulse transmission condition has a reference transmission strength, whereas the second RF pulse transmission condition has a transmission strength equal to "the reference transmission strength"+2 decibels. Further, for the purpose of emphasizing inhomogeneity of the RF (B1) strength levels, an image of a water phantom containing an electrolyte was taken. A distribution of brightness levels in the picture n shown in FIG. 10B corresponds to an area in which the signal intensity levels changed due to the increase in the transmission strength to arrive at "the reference transmission strength"+2 decibels. Further, although the brightness levels are lower at the center of the phantom in the picture m, the imaging is achieved in the picture n (in the area where the excitation flip angle is large). As explained here, it is clearly indicated that it is possible to observe the changes in the signal intensities based on the transmission distribution.

The second embodiment is also explained on the assumption that the data acquiring process is performed twice, i.e., the data acquiring process performed by the first acquiring unit 25a and the data acquiring process performed by the second acquiring unit 25b; however, the MRI apparatus according to the exemplary embodiments is not limited to this example. The data acquiring process may be performed an arbitrary number of times determined in advance. However, considering the imaging time becoming longer, it is preferable to perform the data acquiring process twice or three times.

For example, when the data acquiring process is performed three times, the data acquiring units may be configured so that the acquisition FOV in the phase encoding direction is three times larger than the imaging FOV. Further, the data acquiring units may be configured so as to control the phase encoding amounts in such a manner that the acquired pieces of data are positioned adjacent to one another in the k space. Further, it is desirable to configure the image reconstructing unit so as to shift the position of the center of the imaging process in the phase encoding direction during the data acquiring process by an amount 1.5 times larger than the imaging FOV. With these arrangements, the image reconstructing unit reconstructs three split pictures within one image, as a result of the reconstructing process. One picture corresponds to a picture reconstructed by using, for each of the pixels, the average of the signal intensity of the data acquired by using the first RF pulse transmission condition, the signal intensity of the data acquired by using the second RF pulse transmission condition, and the signal intensity of the data acquired by using a third RF pulse transmission condition. Another picture corresponds to a picture reconstructed by using the difference between the signal intensity of the data acquired by using the first RF pulse transmission condition and the signal intensity of the data acquired by using the second RF pulse transmission condition. Further, yet another picture corresponds to a picture reconstructed by using the difference between the signal intensity of the data acquired by using the second RF pulse transmission condition and the signal intensity of the data acquired by using the third RF pulse transmission condition.

FIG. 11 is a flowchart of a processing procedure performed by the control unit 25 according to the second embodiment. In the second embodiment, it is assumed that the data acquiring process is performed twice, i.e., the data acquiring process performed by the first acquiring unit 25a and the data acquiring process performed by the second acquiring unit 25b. Accordingly, the process at steps S201 through S203 shown in FIG. 11 is repeatedly performed two times. As mentioned above, the MRI apparatus according to the exemplary embodiments, however, is not limited to this example. The process at steps S201 through S203 shown in FIG. 11 may be repeatedly performed an arbitrary number of times determined in advance.

First, like in the first embodiment, an image taking process performed by the MRI apparatus 100 is started when an operator such as a radiological technician or a medical doctor designates an imaging protocol. Subsequently, like in the first embodiment, in the control unit 25, the first acquiring unit 25a sets the first RF pulse transmission condition (step S201) and acquires data (step S202).

The control unit 25 judges whether the data acquiring process based on the RF pulse transmission conditions included in the imaging protocol is finished (step S203). In the second embodiment, the imaging protocol also includes the second RF pulse transmission condition. Thus, the control unit 25 determines that the data acquiring process is not finished (step S203: No), and the second acquiring unit 25b sets the second RF pulse transmission condition (step S201) and acquires data (step S202).

Once again, the control unit 25 judges whether the data acquiring process based on the RF pulse transmission conditions included in the imaging protocol is finished (step S203). When it is determined that the data acquiring process is finished (step S203: Yes), the image reconstructing unit 25c subsequently reconstructs an image by using the data acquired by the first acquiring unit 25a and the data acquired by the second acquiring unit 25b (step S204). In this situation, unlike in the first embodiment, the image reconstructing unit 25c reconstructs the image by treating the data acquired by the first acquiring unit 25a as the data corresponding to the odd-numbered echo positions in the k space and treating the data acquired by the second acquiring unit 25b as the data corresponding to the even-numbered echo positions in the k space.

After that, the image combining unit 25d performs a combining process on the images obtained as a result of the reconstructing process performed by the image reconstructing unit 25c (step S205). In this situation, unlike in the first embodiment, the image combining unit 25d performs the combining process on the two split pictures. For example, the image combining unit 25d performs an adding process on the split two pictures by using the absolute values for each of the pixels so as to generate an image corresponding to the imaging FOV (i.e., one picture within one image).

As explained above, the MRI apparatus 100 according to the second embodiment executes the pulse sequence based on the first RF pulse transmission condition, while controlling the phase encoding amount in such a manner that the acquired data corresponds to the odd-numbered echo positions in the k space. Further, the MRI apparatus 100 executes the pulse sequence based on the second RF pulse transmission condition, while controlling the phase encoding amount in such a manner that the acquired data corresponds to the even-numbered echo positions in the k space. Further, the MRI apparatus 100 reconstructs the image by treating the data acquired by using the first RF pulse transmission condition as the data corresponding to the odd-numbered echo positions in the k space and treating the data acquired by using the second RF pulse transmission condition as the data corresponding to the even-numbered echo positions in the k space. Subsequently, the MRI apparatus 100 performs the combining process on the two split pictures appearing in the reconstructed image. As a result, according to the second embodiment, it is possible to reduce the degradations of the image caused by the inhomogeneity of the RF (B1) strength levels.

Further, the second embodiment is not related to a method for acquiring data used for reconstructing a plurality of images, but is related to the method for acquiring the data corresponding to one image. For this reason, even if the S/N ratio is the same as that in the first embodiment, it is possible to achieve the same S/N ratio more efficiently than in the first embodiment.

Third Embodiment

Next, the MRI apparatus 100 according to a third embodiment will be explained. The MRI apparatus 100 according to the third embodiment has a similar configuration to that of the MRI apparatus 100 according to the first embodiment. Like the control unit 25 according to the first embodiment, the control unit 25 according to the third embodiment includes, in particular, the first acquiring unit 25a, the second acquiring unit 25b, the image reconstructing unit 25c, and the image combining unit 25d. It should be noted, however, that the MRI apparatus 100 according to the third embodiment includes two electric-power transmitting systems for one or more transmission coils. In other words, by using the two electric-power transmitting systems, the MRI apparatus 100 according to the third embodiment changes the RF pulse transmission condition by changing at least one of the following so that the distribution itself of the RF (B1) strength levels is changed during the two-time data acquiring processes: the amplitude, the phase, the waveform, and a combination of any of these.

More specifically, the first and the second embodiments are based on the assumption that, for example, the transmission strength based on the second RF pulse transmission condition is arranged to be uniformly higher than the transmission strength based on the first RF pulse transmission condition, over the entire slicing plane. In this situation, because the distribution of Specific Absorption Rates (SARs) also uniformly changes (as the square of the multiplying factor of the strength), it is disadvantageous from a viewpoint of the transmission power. In contrast, according to the third embodiment, because the multiplying factor of the strength is different for each of the systems, the distribution of the SARs does not necessarily changes uniformly. For this reason, the distribution of the SARs according to the third embodiment is not as large as the distributions of the SARs according to the first and the second embodiments. It is therefore more advantageous from a viewpoint of the transmission power.

This feature will be further explained in detail. The following two structures will be discussed as examples of configurations in which a plurality of electric-power transmitting systems are provided for one or more transmission coils. In the first structure, a plurality of electric-power supplying points are provided for one transmission coil so that the supplies of the RF pulses to the electric-power supplying points are controlled independently of each other. In the second structure, a plurality of transmission coils (a plurality of channels) are provided so that the supplies of the RF pulses to the transmission coils are controlled independently of each other.

In the first structure, the MRI apparatus includes, for example, one bird-cage-type transmission coil that is in the shape of a circular cylinder. For example, two electric-power supplying points positioned so as to be 90 degrees apart from each other on the circular cylinder are provided for the transmission coil. The MRI apparatus supplies an RF pulse to each of the electric-power supplying points independently. In other words, to each of the electric-power supplying points, the MRI apparatus supplies a different one of the RF pulses that are different from each other in at least one of the following: the amplitude, the phase, the waveform, and a combination of any of these.

In contrast, in the second structure, to each of the plurality of transmission coils, the MRI apparatus supplies a different one of the RF pulses that are different from each other in at least one of the following: the amplitude, the phase, the waveform, and a combination of any of these.

In both of these structures, a different one of the mutually different RF pulses is supplied to each of the systems, because the plurality of electric-power transmitting systems are controlled independently of each other. Thus, it is possible to partially and flexibly control the influence appearing on the slicing plane.

A more specific example will be explained. When the method explained in the first embodiment is used, let us assume that an excitation flip angle of "80°" is set as the first RF pulse transmission condition, whereas an excitation flip angle of "90°" is set as the second RF pulse transmission condition. In this situation, the excitation flip angle in different parts on the inside of the subject uniformly becomes larger, and the distribution of the SARs also uniformly becomes larger.

In contrast, when the first structure or the second structure described above is used, it is possible to change the distribution itself of the RF (B1) strength levels by, for example, setting an excitation flip angle of "80°" as the first RF pulse transmission condition for both of the first and the second systems, while setting an excitation flip angle of "70°" for the first system and an excitation flip angle of "90°" for the second system as the second RF pulse transmission condition.

In this situation, the excitation flip angle in a part excited by the second system becomes larger; however, on the contrary, the excitation flip angle in a part excited by the first system becomes smaller. Thus, the distribution of the SARs does not become larger uniformly.

The example described above is a mere example. Thus, it is possible to set any of the other parameters such as the phase and the waveform, or a combination of any of these. Further, the number of electric-power transmitting systems does not necessarily have to be two. An arbitrary number of systems (e.g., three) may be used.

As explained above, according to the third embodiment, it is possible to supply a different one of the mutually different RF pulses to each of the plurality of electric-power transmitting systems. Thus, it is possible to partially and flexibly control the influence appearing on the slicing plane. Consequently, it is also possible to mitigate increases in the SARs depending on the setting.

In the exemplary embodiments and the modification examples thereof described above, although the first RF pulse transmission condition and the second RF pulse transmission condition are different from each other, the pulse sequence executed by the first acquiring unit 25a and the pulse sequence executed by the second acquiring unit 25b are of the same type, and also, the other conditions except for the RF pulse transmission conditions are mutually the same. In this situation, the type of the pulse sequence refers to, for example, Spin Echo (SE) or Field Echo (FE). The other conditions refer to, for example, the Echo Time (TE) and the Inversion Time (TI).

The present embodiment is also applicable to a situation in which the RF pulse transmission conditions and the conditions related to the phase encoding process are different from each other, while the other conditions are mutually the same. In this situation, the conditions related to the phase encoding process include, for example, phase encoding patterns. In other words, for example, as explained in the modification example of the first embodiment, the phase encoding patterns may be different from each other in addition to the RF pulse transmission conditions, i.e., the data in the entirety of the k space is acquired in the acquiring process performed by the first acquiring unit 25a, whereas the data in a partial region of the k space is acquired in the acquiring process performed by the second acquiring unit 25b. In that situation, the other conditions are mutually the same.

Also, the conditions related to the phase encoding process include, for example, schedules for positioning in the k space. In other words, for example, as explained in the second embodiment, the schedules for positioning in the k space may be different from each other in addition to the RF pulse transmission conditions, i.e., the acquiring process by the first acquiring unit 25a is performed while controlling the phase encoding amount in such a manner that the acquired data corresponds to the odd-numbered echo positions in the k space, whereas the acquiring process by the second acquiring unit 25b is performed while controlling the phase encoding amount in such a manner that the acquired data corresponds to the even-numbered echo positions in the k space. In that situation, the other conditions are mutually the same. Furthermore, for example, as explained in the modification example of the second embodiment, the present embodiment is applicable to a situation where both the phase encoding patterns and the schedules for the positioning in the k space are different from each other, in addition to the RF pulse transmission conditions. In that situation, the other conditions are mutually the same.

As explained above, the magnetic resonance imaging apparatus according to the exemplary embodiments includes the first acquiring unit, the second acquiring unit, and the combining unit. The first acquiring unit acquires the data by executing the pulse sequence based on the first radio-frequency pulse transmission condition, whereas the second acquiring unit acquires the data by executing the pulse sequence based on the second radio-frequency pulse transmission condition that is different from the first radio-frequency pulse transmission condition. The combining unit performs the combining process either on the data acquired by the first acquiring unit and the data acquired by the second acquiring unit or on the data obtained by reconstructing the data acquired by the first acquiring unit and the data obtained by reconstructing the data acquired by the second acquiring unit.

In this situation, the "first acquiring unit" denotes, for example, "the first acquiring unit 25a" explained in the first, the second, and the third embodiments. The "second acquiring unit" denotes, for example, "the second acquiring unit 25b" explained in the first, the second, and the third embodiments. Further, the "radio-frequency pulse transmission conditions" denotes, for example, the "RF pulse transmission conditions" explained in the first, the second, and the third embodiments. Furthermore, the "combining unit" denotes, for example, the "image reconstructing unit 25c" and the "image combining unit 25d" explained in the first, the second, and the third embodiments.

By using the MRI apparatus according to at least one of the exemplary embodiments described above, it is possible to reduce the degradations of the image caused by the inhomogeneity of the RF (B1) strength levels.

Although some exemplary embodiments of the present invention have been described, these exemplary embodiments are presented only as examples and are not intended to limit the scope of the invention. The exemplary embodiments described herein may be embodied in a variety of other forms. Furthermore, various omissions, substitutions, and modifications may be made without departing from the spirit of the invention. As the exemplary embodiments and modifications thereof fall within the scope and the spirit of the invention, the exemplary embodiments and the modifications thereof are also covered by the invention defined in the accompanying claims and equivalents thereof.

What is claimed is:

1. A magnetic resonance imaging apparatus comprising:
 a first acquiring unit configured to acquire data by executing a first pulse sequence based on a first radio-frequency (RF) pulse transmission condition having a first B1 inhomogeneity condition;
 a second acquiring unit configured to acquire data by executing a second pulse sequence based on a second RF pulse transmission condition having a second B1 inhomogeneity condition different from the first B1 inhomogeneity condition; and a combining unit configured to perform a combining process, after execution of said first and second pulse sequences, either (a) on the data acquired by the first acquiring unit and the data acquired by the second acquiring unit or (b) on data obtained by reconstructing a first image based on the data acquired by the acquiring unit and data obtained by reconstructing a second image based on data obtained by reconstructing the data acquired by the second acquiring unit, wherein the first and second acquiring units independently control a plurality of electric-power transmitting systems that are configured to supply an RF pulse to a transmission coil so as to change a distribution of B1 strength and B1 inhomogeneity between data acquisition by the first acquiring unit and data acquisition by the second acquiring unit by differentiating at least one of an amplitude, a phase, and a waveform of the RF pulse between the first RF pulse transmission condition and the second RF pulse transmission condition.

2. The magnetic resonance imaging apparatus according to claim 1, wherein the first acquiring unit controls a phase encoding amount in such a manner that the acquired data corresponds to odd-numbered echo positions in a k space, the second acquiring unit controls a phase encoding amount in such a manner that the acquired data corresponds to even-numbered echo positions in the k space, and the combining unit reconstructs an image by treating the data acquired by the first acquiring unit as data corresponding to the odd-numbered echo positions in the k space and treating the data acquired by the second acquiring unit as data corresponding to the even-numbered echo positions in the k space.

3. The magnetic resonance imaging apparatus according to claim 1, wherein the combining unit performs the combining process by comparing signal intensities for each set of pixels that are in a mutually same spatial position between the first image and the second image and further selecting a maximum value among the signal intensities.

4. The magnetic resonance imaging apparatus according to claim 1, wherein the combining unit performs the combining process by comparing signal intensities for each set of pixels that are in a mutually same spatial position between the first image and the second image and further either adding together values of the signal intensities or calculating a sum of squares of the signal intensities.

5. The magnetic resonance imaging apparatus according to claim 2, wherein one of the first and the second acquiring units acquires data in an entirety of the k space, whereas the other of the first and the second acquiring units acquires data in a partial region of the k space, and the combining unit supplements data in a region from which no data is acquired by the other of the first and the second acquiring units that acquired the data in the partial region of the k space, by performing an estimating process based on the data acquired by the one of the first and the second acquiring units that acquired the data in the entirety of the k space.

6. The magnetic resonance imaging apparatus according to claim 1, wherein the first pulse sequence executed by the first acquiring unit and the second pulse sequence executed by the second acquiring unit are of a mutually same type and are performed under a mutually same condition except for the first RF pulse transmission condition and the second RF pulse transmission condition, and with respect to the first RF pulse transmission condition and the second RF pulse transmission condition, the first acquiring unit and the second acquiring unit change at least one of the amplitude, the phase, and the waveform of the RF pulse radio supplied to the transmission coil.

7. The magnetic resonance imaging apparatus according to claim 1, wherein the first acquiring unit acquires data in an entirety of a k space, the second acquiring unit acquires data in a partial region of the k space, and the combining unit supplements data in a region from which no data is acquired by the second acquiring unit by performing a copying process or an estimating process based on the data acquired by the first acquiring unit.

8. The magnetic resonance imaging apparatus according to claim 1, wherein the first acquiring unit acquires data in an entirety of a k space while thinning out the data, the second acquiring unit acquires data in a partial region of the k space while thinning out the data, and the combining unit supplements data thinned by the first acquiring unit by performing an estimating process while using a linear combination of sensitivity distributions of coils, and also, supplements data in a region from which no data is acquired by the second acquiring unit and data thinned by the second acquiring unit by performing an estimating process based on the data acquired by the first acquiring unit.

9. The magnetic resonance imaging apparatus according to claim 1, wherein the first acquiring unit acquires data in an entirety of a k space while thinning out the data, the second acquiring unit acquires data in a partial region of the k space while thinning out the data, and the combining unit supplements data in a region from which no data is acquired by the second acquiring unit by performing an estimating process based on the data acquired by the first acquiring unit, and also, supplements data thinned by the first acquiring unit and the second acquiring unit by performing an estimating process while using a linear combination of sensitivity distributions of coils.

* * * * *